(12) United States Patent
Iwase

(10) Patent No.: US 10,665,738 B2
(45) Date of Patent: May 26, 2020

(54) GAS BARRIER FILM, SOLAR CELL, AND MANUFACTURING METHOD OF GAS BARRIER FILM

(71) Applicant: FUJIFILM Corporation, Tokyo (JP)

(72) Inventor: Eijiro Iwase, Ashigara•kami•gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/246,023

(22) Filed: Jan. 11, 2019

(65) Prior Publication Data

US 2019/0148575 A1 May 16, 2019

Related U.S. Application Data

(63) Continuation of application No. PCT/JP2017/025910, filed on Jul. 18, 2017.

(30) Foreign Application Priority Data

Jul. 26, 2016 (JP) .................................. 2016-146119
Jan. 30, 2017 (JP) .................................. 2017-014656

(51) Int. Cl.
*H01L 31/0392* (2006.01)
*H01L 31/0216* (2014.01)
(Continued)

(52) U.S. Cl.
CPC ........ *H01L 31/03925* (2013.01); *B32B 27/06* (2013.01); *B32B 27/16* (2013.01);
(Continued)

(58) Field of Classification Search
CPC .. C09D 133/04; C09D 151/08; C09D 151/00; C09D 175/16; C09D 151/003;
(Continued)

(56) References Cited

U.S. PATENT DOCUMENTS

2009/0242026 A1* 10/2009 Miyaji .............. B32B 17/10018
                                                            136/256
2011/0103849 A1   5/2011 Nishiwaki
(Continued)

FOREIGN PATENT DOCUMENTS

JP    2005-289041 A    10/2005
JP    2008-272968 A    11/2008
(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2017/025910, dated Feb. 7, 2019, with English translation.
(Continued)

*Primary Examiner* — Golam Mowla
(74) *Attorney, Agent, or Firm* — Birch, Stewart, Kolasch & Birch, LLP

(57) ABSTRACT

An object of the present invention is to provide a gas barrier film which can prevent the damage of an inorganic layer even in a case where the gas barrier film is used in a product which undergoes a step of applying pressure, heat, and the like, a solar cell using the gas barrier film, and a manufacturing method of the gas barrier film. The object is achieved by a gas barrier film having a support and an inorganic layer and a protective organic layer on one surface of the support, in which the protective organic layer has a polymerized substance of a graft copolymer having an acryl polymer as a main chain and having, as a side chain, at least either an acryloyl group-terminated urethane polymer or an acryloyl group-terminated urethane oligomer, a polymerized substance of a (meth)acrylate monomer having three or more functional groups, a polymerized substance of the graft copolymer and the (meth)acrylate monomer having three or
(Continued)

more functional groups, a (meth)acrylate polymer, and a silane coupling agent having a (meth)acryloyl group.

19 Claims, 3 Drawing Sheets

(51) Int. Cl.

| | | |
|---|---|---|
| B32B 27/06 | (2006.01) | |
| B32B 27/16 | (2006.01) | |
| B32B 27/30 | (2006.01) | |
| C08F 290/12 | (2006.01) | |
| C09D 133/04 | (2006.01) | |
| C09D 175/16 | (2006.01) | |
| H05B 33/04 | (2006.01) | |
| C09D 151/00 | (2006.01) | |
| C08F 290/06 | (2006.01) | |
| H01L 31/048 | (2014.01) | |
| C09D 4/06 | (2006.01) | |
| H01L 31/046 | (2014.01) | |
| C08G 18/80 | (2006.01) | |
| H01L 51/44 | (2006.01) | |
| H01L 51/52 | (2006.01) | |

(52) U.S. Cl.
CPC .......... *B32B 27/30* (2013.01); *C08F 290/067* (2013.01); *C08F 290/12* (2013.01); *C08G 18/8061* (2013.01); *C09D 4/06* (2013.01); *C09D 133/04* (2013.01); *C09D 151/00* (2013.01); *C09D 175/16* (2013.01); *H01L 31/02167* (2013.01); *H01L 31/03928* (2013.01); *H01L 31/046* (2014.12); *H01L 31/048* (2013.01); *H01L 31/0481* (2013.01); *H05B 33/04* (2013.01); *H01L 51/448* (2013.01); *H01L 51/5253* (2013.01)

(58) Field of Classification Search
CPC ...... C09D 4/06; C08G 18/8061; B32B 27/30; B32B 27/16; B32B 27/06; C08L 2203/16; C08L 2201/14; H05B 33/04; H01L 31/048; H01L 51/448; H01L 31/03925; H01L 31/03928; H01L 51/5253; H01L 31/02167; H01L 31/0481; H01L 31/046; C08F 290/061; C08F 265/06; C08F 222/1006; C08F 290/067; C08F 290/12; C08K 5/5425

See application file for complete search history.

(56) References Cited

U.S. PATENT DOCUMENTS

| | | | | |
|---|---|---|---|---|
| 2011/0256334 | A1* | 10/2011 | Edwards | B32B 27/32 428/69 |
| 2012/0270058 | A1* | 10/2012 | Tsumagari | C08J 7/0423 428/447 |
| 2013/0098429 | A1* | 4/2013 | Funayama | H01L 31/0481 136/251 |
| 2013/0216749 | A1* | 8/2013 | Aiba | A61J 1/10 428/36.6 |
| 2016/0009923 | A1* | 1/2016 | Mitsumoto | C09D 151/06 428/336 |
| 2016/0082688 | A1* | 3/2016 | Nakai | B29C 59/046 428/141 |
| 2016/0207284 | A1 | 7/2016 | Iwase | |
| 2016/0207285 | A1 | 7/2016 | Seki et al. | |
| 2016/0368236 | A1 | 12/2016 | Iwase | |
| 2017/0320307 | A1* | 11/2017 | Iwase | B32B 27/30 |

FOREIGN PATENT DOCUMENTS

| | | |
|---|---|---|
| JP | 2009-269193 A | 11/2009 |
| JP | 2011-143550 A | 7/2011 |
| JP | 2011-526646 A | 10/2011 |
| JP | 2012-171291 A | 9/2012 |
| JP | 2015-66810 A | 4/2015 |
| JP | 2015-66812 A | 4/2015 |
| JP | 2015-157411 A | 9/2015 |
| WO | WO 2015/136993 A1 | 9/2015 |
| WO | WO 2016/125532 A1 | 8/2016 |
| WO | WO 2016/152558 A1 | 9/2016 |

OTHER PUBLICATIONS

International Search Report (Form PCT/ISA/210) for International Application No. PCT/JP2017/025910, dated Oct. 3, 2017, with English translation.

* cited by examiner

GAS BARRIER FILM, SOLAR CELL, AND MANUFACTURING METHOD OF GAS BARRIER FILM

CROSS-REFERENCE TO RELATED APPLICATIONS

This application is a Continuation of PCT International Application No. PCT/JP2017/025910 filed on Jul. 18, 2017, which claims priority under 35 U.S.C. § 119(a) to Japanese Patent Application No. 2016-146119 filed on Jul. 26, 2016 and Japanese Patent Application No. 2017-014656 filed on Jan. 30, 2017. Each of the above applications is hereby expressly incorporated by reference, in its entirety, into the present application.

BACKGROUND OF THE INVENTION

1. Field of the Invention

The present invention relates to a gas barrier film having excellent durability, a solar cell using the gas barrier film, and a manufacturing method of the gas barrier film.

2. Description of the Related Art

There are many products for protecting materials vulnerable to oxygen, water, and the like by using a gas barrier film.

For example, in the case of a luminescent material such as organic electro luminescence (EL), by substituting glass as a substrate with a gas barrier film, flexibility can be obtained. The flexibility also leads to the increase in the added value of the product. Therefore, high expectation is placed on the gas barrier film which can demonstrate high gas barrier performance as a substitute for glass used as a substrate or the like.

For instance, in recent years, particularly from the viewpoint of the protection of the environment and the like, active researches have been performed in the energy sector including solar cells. For example, a large number of researches are performed regarding a Cu—In—Ga—Se (CICS)-based solar cell, an organic thin film solar cell, and the like.

The gas barrier film can also be used in the following industrial hardware. For example, in a case where the glass portion of a solar cell module (solar cell panel) having been used in the related art is substituted with the gas barrier film, the solar cell module can be lightened and can obtain flexibility, ductility, and the like. As a result, the solar cell module can be more freely applied to building materials, that is, the range of use thereof widens, and the solar cell module is expected to be used in various fields.

The gas barrier film used in the above uses is required to have high gas barrier properties in which a moisture vapor transmission rate is about $1\times10^{-3}$ to $1\times10^{-4}$ g/(m²·day) for example.

As the gas barrier film having such high gas barrier properties, an organic-inorganic laminate-type gas barrier film is known. The organic-inorganic laminate-type gas barrier film is a gas barrier film having one or more combinations of an inorganic layer which mainly exhibits gas barrier properties and an organic layer which will become an undercoat layer of the inorganic layer.

For example, JP2009-269193A describes a manufacturing method of a laminate, including repeating a step of depositing an organic layer by providing a coating film by means of coating a substrate with a coating solution containing a monomer or an oligomer and curing the coating film so as to form an undercoat layer including two or more organic layers, and forming an inorganic layer on the undercoat layer by a vacuum deposition method.

As in the gas barrier film described in JP2009-269193A, in a case where an organic layer is formed as an undercoat layer, and then an inorganic layer having gas barrier properties is formed, by exploiting the smoothness of the surface of the organic layer, it is possible to form a uniform inorganic layer without defects such as breaking and peeling. Therefore, according to the organic-inorganic laminate-type gas barrier film, by causing the inorganic layer to sufficiently exhibit the gas barrier properties thereof, a gas barrier film having high gas barrier properties can be obtained.

In the organic-inorganic laminate-type gas barrier film, gas barrier properties are mainly exhibited by the inorganic layer as described above. As the inorganic layer, for example, a silicon nitride film, a silicon oxide film, or the like is used.

The inorganic layer, such as a silicon nitride film or a silicon oxide film, used in the gas barrier film is generally a brittle and thin film. Therefore, regarding the organic-inorganic laminate-type gas barrier film, a method is known in which an organic layer is formed on the surface of the gas barrier film, and the organic layer on the surface is caused to function as a protective layer of the inorganic layer. In a case where the organic layer is formed on the surface as a protective layer as described above, it is possible to stably perform processing such as a treatment by so-called Roll to Roll and cutting on the organic-inorganic laminate-type gas barrier film having a fragile inorganic layer.

SUMMARY OF THE INVENTION

Incidentally, according to the examination performed by the inventors of the present invention, in a case where the organic-inorganic laminate-type gas barrier film is combined with a solar cell, an organic EL element, and the like, the obtained gas barrier properties are not necessarily sufficient in many instances.

Regarding this point, the inventors of the present invention conducted an intensive examination. As a result, the inventors have found that in a case where the organic-inorganic laminate-type gas barrier film is used in a solar cell and the like, sufficient gas barrier properties are not obtained simply by combining a gas barrier film having high gas barrier properties, and it is important to prevent in any way the damage of the inorganic layer exhibiting gas barrier properties.

For example, the manufacturing of a solar cell includes a step of assembling a solar cell module.

At this time, in a case where the glass portion of the solar cell module is substituted with a gas barrier film, a load applied to the gas barrier film is not always smaller than a load applied during the process through which the gas barrier film is prepared. Instead, in a step such as a bonding step performed in the manufacturing process of the solar cell module, a high pressure, heat, and the like are applied in many cases, and hence the gas barrier film becomes in a severe environment.

Accordingly, in a case where the organic-inorganic laminate-type gas barrier film is used in a solar cell module and the like, even though an organic layer which will become a protective layer is provided on the surface, in the middle of the step of assembling the solar cell module, the inorganic layer which mainly exhibits gas barrier properties is damaged, and the intended gas barrier properties cannot be obtained.

On the premise that the inorganic layer will be damaged, a method of making a multilayer gas barrier film having a plurality of combinations of an undercoat organic layer and an inorganic layer is also considered. However, in a case where the gas barrier film has a large number of inorganic layers, the cost inevitably increases.

In other words, for the gas barrier film used in a solar cell and the like, it is important to minimize the number of inorganic layers exhibiting gas barrier properties and to design a protective layer which can prevent the damage of the inorganic layer even in a case where the gas barrier film is exposed to a step of applying pressure, heat, and the like.

The present invention is for solving the problems of the technique of the related art, and an object thereof is to provide a gas barrier film having an inorganic layer just as an organic-inorganic laminate-type gas barrier film in which the damage of the inorganic layer can be prevented even in a case where the gas barrier film is used in a product such as a solar cell module that goes through a step of applying pressure, heat, and the like as a manufacturing process, a solar cell using the gas barrier film, and a manufacturing method of the gas barrier film.

In order to achieve the aforementioned object, the present invention provides a gas barrier film comprising a support, at least one inorganic layer on one surface of the support, and a protective organic layer formed on a surface of the inorganic layer that is farthest from the support, in which the protective organic layer has a polymerized substance of a graft copolymer having an acryl polymer as a main chain and having, as a side chain, at least either an acryloyl group-terminated urethane polymer or an acryloyl group-terminated urethane oligomer, a polymerized substance of a (meth)acrylate monomer having three or more functional groups, a polymerized substance of the graft copolymer and the (meth)acrylate monomer having three or more functional groups, a (meth)acrylate polymer, and a silane coupling agent having one or more (meth)acryloyl groups.

In the gas barrier film of the embodiment of the present invention, a weight-average molecular weight of the graft copolymer is preferably equal to or greater than 10,000.

It is preferable that the protective organic layer further has a urethane acrylate oligomer.

It is preferable that a refractive index of a polymerized substance of the urethane acrylate oligomer is equal to or lower than 1.52.

It is preferable that a refractive index of a cured substance of the polymerized substance of the graft copolymer and the (meth)acrylate polymer is equal to or lower than 1.52.

It is preferable that a pencil hardness of the protective organic layer is equal to or higher than H.

It is preferable that a thickness of the protective organic layer is 3 to 30 It is preferable that a haze is equal to or lower than 1.5%, and a total light transmittance is equal to or higher than 88%.

It is preferable that a thermal shrinkage rate is equal to or lower than 2%.

It is preferable that the gas barrier film further comprises an undercoat organic layer on one surface of the support, in which the inorganic layer is on a surface of the undercoat organic layer, and the protective organic layer is on a surface of the inorganic layer.

It is preferable that the gas barrier film further comprises a firm adhesive layer, which contains a binder and lubricating particles on a surface, which is opposite to the surface having the inorganic layer and the protective organic layer, of the support.

Furthermore, the present invention provides a solar cell comprising a photoelectric conversion layer and the gas barrier film of the embodiment of the present invention.

In the solar cell, the photoelectric conversion layer is preferably formed of a compound semiconductor including at least either an element Cu or an element Ag, at least one kind of element selected from the group consisting of Al, Ga, and In, and at least one kind of element selected from the group consisting of S, Se, and Te.

In addition, the present invention provides a manufacturing method of a gas barrier film, comprising a step of forming at least one inorganic layer on one surface of a support and a step of forming at least one organic layer including forming a protective organic layer on a surface of the inorganic layer that is farthest from the support, in which the step of forming an organic layer includes a coating step of coating the surface, on which the organic layer is to be formed, with a polymerizable composition, a drying step of drying the polymerizable composition with which the surface, on which the organic layer is to be formed, is coated, and a curing step of curing the dried polymerizable composition, in the forming of at least one organic layer, a drying temperature in the drying step is equal to or higher than 100° C., and the coating step in the forming of the protective organic layer is a step of coating the surface of the inorganic layer that is farthest from the support, with a polymerizable composition which contains a graft copolymer having an acryl polymer as a main chain and having, as a side chain, at least either an acryloyl group-terminated urethane polymer or an acryloyl group-terminated urethane oligomer, a (meth)acrylate monomer having three or more functional groups, a (meth)acrylate polymer, and a silane coupling agent having one or more (meth)acryloyl groups.

In the manufacturing method of a gas barrier film of the embodiment of the present invention, in the step of forming an organic layer, an undercoat organic layer that becomes an undercoat of the inorganic layer is preferably formed on one surface of the support; in the step of forming an inorganic layer, the inorganic layer is preferably formed on a surface of the undercoat organic layer; and in the step of forming an organic layer, the protective organic layer is preferably formed on a surface of the inorganic layer formed on the surface of the undercoat organic layer.

Furthermore, it is preferable to perform a step of forming a firm adhesive layer containing a binder and lubricating particles on a surface, which is opposite to the surface on which the inorganic layer and the organic layer are formed, of the support.

According to the present invention, even in a case where a gas barrier film having an inorganic layer just as an organic-inorganic laminate-type gas barrier film is used in a product such as a solar cell module which goes through a step of applying pressure, heat, and the like as a manufacturing process, the damage of the inorganic layer can be prevented.

DESCRIPTION OF THE PREFERRED EMBODIMENTS

Hereinafter, a gas barrier film, a solar cell, and a manufacturing method of a gas barrier film of an embodiment of the present invention will be specifically described based on suitable examples described in the attached drawings.

Figure 1:
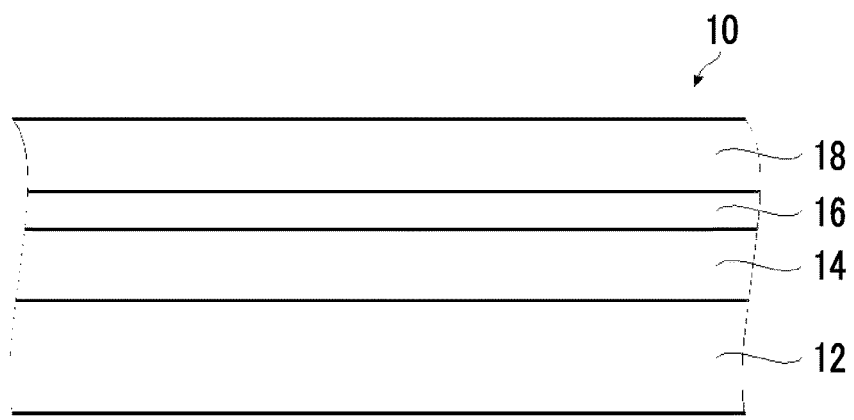
FIG. 1 is a view conceptually showing an example of a gas barrier film of an embodiment of the present invention.

FIG. 1 conceptually shows an example of the gas barrier film of the embodiment of the present invention.

Basically, the gas barrier film 10 shown in FIG. 1 has a support 12, an undercoat organic layer 14 formed on one surface of the support 12, an inorganic layer 16 formed on (surface of) the undercoat organic layer 14, and a protective organic layer 18 formed on the inorganic layer 16. In the gas barrier film 10, the protective organic layer 18 becomes a surface opposite to the support 12.

In the following description, "gas barrier film 10" will be simply referred to as "barrier film 10" as well.

As described above, the barrier film 10 shown in FIG. 1 has the undercoat organic layer 14, the inorganic layer 16, and the protective organic layer 18 on one surface of the support 12. That is, the barrier film 10 has one combination of the undercoat organic layer 14 and the inorganic layer 16.

In the barrier film of the embodiment of the present invention, in addition to the above constitution, various layer constitution can be used.

For example, the barrier film may be constituted with two combinations of the undercoat organic layer 14 and the inorganic layer 16 and the protective organic layer 18 thereon. Alternatively, the barrier film may be constituted with three or more combinations of the undercoat organic layer 14 and the inorganic layer 16 and the protective organic layer 18 thereon.

Otherwise, the barrier film may be constituted with the inorganic layer 16 formed on a surface of the support 12 and the protective organic layer 18 or constituted only with the inorganic layer 16 and the protective organic layer 18. As another option, the barrier film may be constituted with the inorganic layer 16 formed on a surface of the support 12, one or more combinations of the undercoat organic layer 14 and the inorganic layer 16 on the inorganic layer 16, and the protective organic layer 18 on the combinations.

That is, in the gas barrier film of the embodiment of the present invention, various constitutions can be used as long as the gas barrier film has at least one inorganic layer 16 and the protective organic layer 18 formed on a surface of the inorganic layer 16 that is farthest from the support 12. Particularly, in view of productivity and cost, the constitution in FIG. 1, in which the barrier film has one undercoat organic layer 14, one inorganic layer 16, and the protective organic layer 18 on the inorganic layer 16, is suitably used.

In the barrier film 10, as the support 12, it is possible to use various known sheet-like substances used as supports in various gas barrier films, various laminate-type functional films, and the like.

Specifically, examples of substances suitable as the support 12 include films (resin films) formed of various resin materials such as polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, a polymethyl methacrylate resin (PMMA), polycarbonate (PC), polyacrylate, polymethacrylate, polypropylene (PP), polystyrene (PS), an acrylonitrile.butadiene.styrene copolymer (ABS), a cyclic olefin.copolymer (COC), a cycloolefin polymer (COP), and triacetyl cellulose (TAC).

Furthermore, in the present invention, the support 12 may be provided with functional layers (functional films) for obtaining various functions, such as a protective layer, an adhesive layer, a light reflecting layer, an antireflection layer, a light blocking layer, a planarizing layer, a buffer layer, a stress relaxation layer, an easily adhesive layer, a firm adhesive layer, and a lubricating layer.

In the present invention, the functional layers provided on the support 12 may be regarded as a portion of the support 12 or as layers different from the support 12.

These functional layers may be provided on a surface, on which the protective organic layer 18 and the like are formed, of the support 12, on a surface of the support 12 that is opposite to the surface on which the protective organic layer 18 and the like are formed, or on both surfaces of the support 12. In a case where the functional layers are provided on both surfaces of the support 12, the functional layers formed on each surface may be functional layers performing the same function or different functions. Furthermore, in a case where the functional layers performing the same function are formed on both surfaces of the support 12, the functional layers may be formed of the same material or different materials.

In the following description, the surface of the support 12 that is opposite to the surface on which the inorganic layer 16 and the like are formed will be referred to as a rear surface of the support 12 as well.

As one of the preferable functional layers provided on the rear surface of the support 12, an easily adhesive layer, a lubricating layer, a firm adhesive layer, and the like can be exemplified. For example, in a case where a solar cell is formed using the gas barrier film of the embodiment of the present invention, provided that the support 12 has such layers on the rear surface, it is possible to improve the transporting properties, the versatility of adhesiveness with respect to other members, and the like and to stably manufacture a product.

As the functional layers such as an easily adhesive layer, a lubricating layer, and a firm adhesive layer, it is possible to use various known functional layers used in various film-like products such as a gas barrier film.

Examples of the easily adhesive layer include an easily adhesive layer formed using a urethane compound and an isocyanate compound, and the like.

Examples of the firm adhesive layer include a firm adhesive layer containing urethane and acrylate as a binder and lubricating particles.

Examples of the lubricating layer include a matted layer containing a binder formed of urethane, acrylate, an epoxy resin, and the like and particles which may be organic or inorganic substances such as silica and polymethyl methacrylate.

The easily adhesive layer, the lubricating layer, the firm adhesive layer, and the like may be directly mixed into the resin material such as PET which will become the support 12 or may be formed later on the rear surface of the support 12 and the like by a known method such as a coating method. As the method for forming the functional layers, it is possible to use various known methods such as a coating method according to the functional layers to be formed.

Furthermore, a plurality of functional layers may be laminated. For example, a constitution may be adopted in which the easily adhesive layer is provided on both surfaces of the support 12, and the firm adhesive layer is provided on the easily adhesive layer on the rear surface side of the support 12.

The thickness of the support 12 may be appropriately set according to the use, the material forming the support 12, and the like.

According to the examination performed by the inventors of the present invention, the thickness of the support 12 is preferably 5 to 150 µm, and more preferably 10 to 100 µm.

In view of securing sufficient mechanical strength of the barrier film 10, lightening and thinning the barrier film 10, the flexibility of the barrier film 10, and the like, it is preferable that the thickness of the support 12 is within the above range.

In the barrier film 10, the undercoat organic layer 14 as an undercoat layer of the inorganic layer 16 is provided on (one surface of) the support 12.

The undercoat organic layer 14 is a layer formed of an organic compound, and is basically obtained by polymerizing (crosslinking and curing) a monomer, a dimer, an oligomer, and the like which will become the undercoat organic layer 14.

The undercoat organic layer 14 of the support 12 functions as an undercoat layer for appropriately forming the inorganic layer 16 which mainly exhibits gas barrier properties in the barrier film 10.

In a case where the barrier film 10 has such an undercoat organic layer 14, the asperities on the surface of the support 12, the foreign substances having adhered to the surface of the support 12, and the like are embedded in the undercoat organic layer 14, and hence the surface on which the inorganic layer 16 will be deposited can be in a state appropriate for depositing the inorganic layer 16. As a result, it is possible to remove regions, such as the asperities and the shadows of foreign substances on the surface of the support 12, on which an inorganic compound that will become the inorganic layer 16 is not easily deposited, and to deposit an appropriate inorganic layer 16 on the entire surface of the substrate without voids.

In the barrier film 10, as the material forming the undercoat organic layer 14, various known organic compounds can be used without limitation.

Specifically, examples of suitable materials include thermoplastic resins such as polyester, a (meth)acryl resin, a methacrylic acid-maleic acid copolymer, polystyrene, a transparent fluororesin, polyimide, fluorinated polyimide, polyamide, polyamide imide, polyether imide, cellulose acylate, polyurethane, polyether ether ketone, polycarbonate, alicyclic polyolefin, polyarylate, polyether sulfone, polysulfone, fluorene ring-modified polycarbonate, alicyclic ring-modified polycarbonate, fluorene ring-modified polyester, and an acryl compound, polysiloxane, and films of other organic silicon compounds. A plurality of these materials may be used in combination.

Among these, an undercoat organic layer 14 constituted with a polymerized substance of a radically curable compound and/or a cationically curable compound having an ether group as a functional group is preferable because such a layer has excellent glass transition temperature and hardness.

Among the above materials, for example, an acryl resin, a methacryl resin, and the like containing a polymer of a monomer, an oligomer, and the like of acrylate and/or methacrylate as a main component is particularly preferable as the undercoat organic layer 14, because such a material has a low refractive index, high transparency, and excellent optical characteristics.

Particularly, for example, an acryl resin and a methacryl resin, such as dipropylene glycol di(meth)acrylate (DPGDA), trimethylolpropane tri(meth)acrylate (TMPTA), and dipentaerythritol hexa(meth)acrylate (DPHA), are suitable which contain a polymer of a monomer, an oligomer, and the like of acrylate and/or methacrylate having two or more functional groups and particularly having three or more functional groups as a main component. It is also preferable to use a plurality of acryl resins, methacryl resins, and the like described above.

Furthermore, the same organic layer as the protective organic layer 18 which will be described later can also be suitably used as the undercoat organic layer 14.

The thickness of the undercoat organic layer 14 may be appropriately set according to the material forming the undercoat organic layer 14, the support 12, and the like. According to the examination performed by the inventors of the present invention, the thickness of the undercoat organic layer 14 is preferably 0.5 to 5 µm, and more preferably 1 to 3 µm.

In a case where the thickness of the undercoat organic layer 14 is equal to or greater than 0.5 µm, the asperities on the surface (surface on which the undercoat organic layer 14 and the like will be formed) of the support 12 and the foreign substances having adhered to the surface of the support 12 can be embedded in the undercoat organic layer 14, and the surface of the undercoat organic layer 14, that is, the surface on which the inorganic layer 16 will be deposited can be planarized.

Furthermore, in a case where the thickness of the undercoat organic layer 14 is equal to or smaller than 5 µm, it is possible to suitably inhibit the cracking of the undercoat organic layer 14 and the problems such as curling of the barrier film 10 that occur in a case where the undercoat organic layer 14 is excessively thick.

In a case where the barrier film 10 has a plurality of undercoat organic layers 14 as described above, the undercoat organic layers 14 may have the same thickness or different thicknesses. Furthermore, the undercoat organic layers 14 may be formed of the same material or different materials.

The undercoat organic layer 14 may be formed (deposited) by a known method for forming a layer by using an organic compound according to the undercoat organic layer 14 to be formed.

For example, the undercoat organic layer 14 may be formed by a so-called coating method in which a polymerizable composition (coating composition) containing an organic solvent, an organic compound (a monomer, a dimer, a trimer, an oligomer, a polymer, or the like) which will become the undercoat organic layer 14, a surfactant, a silane coupling agent, and the like is prepared, coating and drying are performed using the polymerizable composition, and then, if necessary, the organic compound is polymerized (crosslinked) by ultraviolet irradiation and the like.

It is preferable that the undercoat organic layer 14 is formed by so-called roll to roll. The same is true for the aforementioned functional layers. In the following description, "roll to roll" will be referred to as "RtoR" as well.

As it is known, RtoR is a manufacturing method in which a material for deposition is wound off from a material roll obtained by winding a long material for deposition in the form of a roll, deposition is performed in a state of transporting the material for deposition in a longitudinal direction, and the material for deposition having undergone deposition is wound in the form of a roll. In a case where RtoR is used, a high productivity and a high production efficiency are obtained.

The inorganic layer 16 is a layer formed of an inorganic compound.

In the barrier film 10, the inorganic layer 16 mainly exhibits the intended gas barrier properties.

As the material forming the inorganic layer 16, various inorganic layers which are formed of inorganic compounds exhibiting gas barrier properties and used in known gas barrier layers can be used without limitation.

Specifically, examples of suitable materials include films formed of inorganic compounds like a metal oxide such as aluminum oxide, magnesium oxide, tantalum oxide, zirconium oxide, titanium oxide, or indium tin oxide (ITO); a metal nitride such as aluminum nitride; a metal carbide such as aluminum carbide; an oxide of silicon such as silicon oxide, silicon oxynitride, silicon oxycarbide, or silicon oxynitride carbide; a nitride of silicon such as silicon nitride or silicon nitride carbide; a carbide of silicon such as silicon carbide; hydrides of these; hydrogenous compounds of these; and the like. In addition, a mixture of two or more kinds of these materials can also be used.

Particularly, silicon nitride, silicon oxide, silicon oxynitride, aluminum oxide, and a mixture of two or more kinds of these materials can be suitably used because these materials have high transparency and can exhibit excellent gas barrier properties. Among these, silicon nitride is particularly suitably used because this compound has excellent gas barrier properties and high transparency.

The film thickness of the inorganic layer 16 may be appropriately determined according to the material forming the inorganic layer 16, such that the intended gas barrier properties can be exhibited. According to the examination performed by the inventors of the present invention, the thickness of the inorganic layer 16 is preferably 10 to 200 nm, more preferably 15 to 100 nm, and particularly preferably 20 to 75 nm.

In a case where the thickness of the inorganic layer 16 is equal to or greater than 10 nm, it is possible to form an inorganic layer 16 which stably exhibits sufficient gas barrier properties. Generally, the inorganic layer 16 is brittle. Therefore, in a case where the inorganic layer 16 is excessively thick, breaking, fissuring, peeling, and the like are likely to occur. However, by setting the thickness of the inorganic layer 16 to be equal to or smaller than 200 nm, the occurrence of breaking can be prevented.

In a case where the barrier film 10 has a plurality of inorganic layers 16 as described above, the inorganic layers 16 have the same thickness or different thicknesses. Furthermore, the inorganic layers 16 may be formed of the same material or different materials.

In the barrier film 10, as the method for forming the inorganic layer 16, various known inorganic layer (inorganic film)-forming methods can be used without limitation according to the inorganic layer 16 to be formed.

Specifically, the inorganic layer 16 may be formed by plasma CVD such as Capacitively Coupled Plasma (CCP)-Chemical Vapor Deposition (CVD) and Inductively Coupled Plasma (ICP)-CVD, sputtering such as magnetron sputtering and reactive sputtering, or a vapor-phase deposition method such as vacuum vapor deposition.

It is also preferable to form the inorganic layer 16 by RtoR.

On the inorganic layer 16, the protective organic layer 18 is formed. The protective organic layer 18 is a portion which is a feature of the present invention. The protective organic layer 18 is a layer for protecting the inorganic layer 16 so as to prevent the inorganic layer 16 from being damaged even though the barrier film 10 is subjected to a step of applying pressure, heat, and the like in a case where the barrier film 10 is used, for example, in a solar cell module or the like.

In the barrier film 10 of the embodiment of the present invention, the protective organic layer 18 contains a polymerized substance of a graft copolymer which has an acryl polymer as a main chain and has, as a side chain, at least either an acryloyl group-terminated urethane polymer or an acryloyl group-terminated urethane oligomer, a polymerized substance of a (meth)acrylate monomer having three or more functional groups, a polymerized substance of the graft copolymer which has an acryl polymer as a main chain and has, as a side chain, at least either an acryloyl group-terminated urethane polymer or an acryloyl group-terminated urethane oligomer and the (meth)acrylate monomer having three or more functional groups, a (meth)acrylate polymer, and a silane coupling agent having one or more (meth)acryloyl groups.

The silane coupling agent includes various compounds generated from silane coupling agents, such as a hydrolysate of a silane coupling agent, a hydrogen bonding substance of a silane coupling agent, and a dehydration condensate of a silane coupling agent.

More specifically, the protective organic layer 18 is a layer formed by coating the inorganic layer 16 with a polymerizable composition (coating composition), which contains a graft copolymer having an acryl polymer as a main chain and having, as a side chain, at least either an acryloyl group-terminated urethane polymer or an acryloyl group-terminated urethane oligomer, a (meth)acrylate monomer having three or more functional groups, a (meth) acrylate polymer, and a silane coupling agent, and drying and polymerizing (curing) the polymerizable composition.

Because the barrier film 10 of the embodiment of the present invention has the protective organic layer 18, even in a case where the barrier film 10 is used in a product such as a solar cell module which goes through a step of applying pressure and/or heat as a manufacturing process, the damage of the inorganic layer can be prevented.

In the following description, "graft copolymer having an acryl polymer as a main chain and having, as a side chain, at least either an acryloyl group-terminated urethane polymer or an acryloyl group-terminated urethane oligomer" will be simply referred to as "graft copolymer" as well.

As described above, in a case where the gas barrier film having an inorganic layer is used in a product such as a solar cell module which goes through a step of applying pressure, heat, and the like as a manufacturing process, the inorganic layer is damaged, and hence the intended gas barrier properties are not obtained.

In the gas barrier film having an inorganic layer and a protective organic layer protecting the inorganic layer, the damage (destruction) of the inorganic layer occurs roughly as two phenomena. The first phenomenon corresponds to a case where the protective organic layer 18 is and penetrated and the inorganic layer is damaged in the manufacturing process of a solar cell module and the like. The second phenomenon corresponds to a case where shear force is applied to the inorganic layer 16.

Specifically, in the first phenomenon, the protective organic layer 18 is broken or peeled due to the external force such as the roughness (asperities) of pass rolls (guide rolls) used in the manufacturing process or the slip between nip rolls, and as a result, an external member such as a roll contacts the inorganic layer 16, and the thin inorganic layer 16 is broken. In the second phenomenon, in a case where the support 12 is stretched due to heat, tension applied to the gas barrier film, or the like, peeling (shear fracture) occurs between the support 12 and the undercoat organic layer, and as a result, the inorganic layer 16 as the upper layer is also broken.

That is, in order to protect the inorganic layer, the protective organic layer which will become the surface of the gas barrier film 10 needs to have sufficient hardness and high protective performance, and it is preferable that an organic-inorganic laminate structure is formed on a support which is hardly deformed by heat.

Furthermore, in order for the inorganic layer 16 to be appropriately protected by the protective organic layer 18, it is important for the protective organic layer 18 to be hard and have high protective performance. In addition, it is important for the adhesiveness between the inorganic layer 16 and the protective organic layer 18 to be high.

For example, JP2015-171798A suggests an organic-inorganic laminate-type gas barrier film having a protective organic layer which protects an inorganic layer, exhibits excellent adhesiveness with respect to a sealant layer to which the protective organic layer adheres, and uses the same graft copolymer as that of the present invention.

The protective organic layer using the acryl polymer having acryloyl group-terminated urethane as a side chain exhibits excellent adhesiveness with respect to an object which will adhere to the protective organic layer, but the surface hardness of the protective organic layer is insufficient. Accordingly, depending on the shape of a pass roll having asperities such as a dimple roll or gravure roll, the asperities penetrate even the inorganic layer. Therefore, such a protective organic layer is insufficient for protecting the inorganic layer. Furthermore, JP2015-171798A does not describe the thermal shrinkage of a support.

As a general method for improving the hardness of the protective organic layer using the graft copolymer, a method of adding a polyfunctional acrylate monomer such as DPHA to the graft copolymer is known.

However, the inventors of the present invention have found that in a case where the stress of such a protective organic layer increases, that is, in a case where a monomer which undergoes volumetric shrinkage at the time of polymerization is added, the protective organic layer formed on an inorganic layer is easily peeled due to the internal stress thereof. In other words, even though the protective organic layer has high hardness, because the adhesiveness thereof with respect to the inorganic layer is insufficient, the protective organic layer cannot sufficiently function as a protective layer. In order to improve the protective performance, it is advantageous to increase the thickness of the protective organic layer. However, in a case where the thickness of the protective organic layer is increased, the internal stress markedly increases, and hence the adhesiveness deteriorates.

That is, with the protective organic layer of the related art, it is difficult to form a hard and thick protective organic layer which exhibits excellent adhesiveness with respect to an inorganic layer.

In contrast, the barrier film 10 of the embodiment of the present invention has the protective organic layer 18 formed by coating the inorganic layer 16 with the polymerizable composition containing a graft copolymer, a (meth)acrylate monomer having three or more functional groups, a (meth)acrylate polymer, and a silane coupling agent and drying and curing the polymerizable composition.

Accordingly, due to the graft copolymer, the protective organic layer 18 of the barrier film 10 of the embodiment of the present invention exhibits high adhesiveness with respect to the inorganic layer 16. Furthermore, due to the polymerization between the graft copolymers, the polymerization between the (meth)acrylate monomers having three or more functional groups, and the polymerization between the graft copolymer and the (meth)acrylate monomer having three or more functional groups, the protective organic layer 18 has high hardness. In addition, because the protective organic layer 18 has the (meth)acrylate polymer, the internal stress is reduced, that is, the shrinkage is prevented, and hence the deterioration of the adhesiveness can be prevented.

As described above, in the barrier film 10 of the embodiment of the present invention, as the inorganic layer 16, a silicon nitride film is suitably used. The silicon nitride film is extremely compact and has high density. Therefore, for example, even though the silicon nitride film is a thin film having a thickness of about 30 nm, extremely high gas barrier properties are obtained. That is, in a case where a silicon nitride film is used as the inorganic layer 16, a high-quality thin gas barrier film is obtained which has excellent gas barrier properties, high transparency, and excellent flexibility.

Incidentally, in a case where the inorganic layer 16 is made thin, due to the external force described above, the inorganic layer 16 is more easily damaged.

In other words, in a case where an inorganic layer 16, such as a silicon nitride film, is used which is compact, has high density, and is thin but has high gas barrier properties, it is particularly important for the protective organic layer 18 to be hard and exhibit excellent adhesiveness with respect to the inorganic layer 16.

As described above, the graft copolymer used in the protective organic layer 18 of the present invention is a graft copolymer having an acryl polymer as a main chain and having, as a side chain, an acryloyl group-terminated urethane polymer and/or an acryloyl group-terminated urethane oligomer.

The graft copolymer may be a copolymer having a structure in which urethane monomer units are arranged as a side chain in places of the monomer unit of the acryl main chain which forms a backbone. The graft copolymer may have a structure generally formed by graft copolymerization.

Such a graft copolymer has high transparency and hardly undergoes yellowing. Furthermore, the graft copolymer has a low refractive index and can form a protective organic layer 18 having excellent light transmittance.

The acryl main chain of the graft copolymer may be formed by the homopolymerization of each of an acrylate monomer, an ethyl acrylate monomer, and the like. Alternatively, the acryl main chain of the graft copolymer may be a copolymer of any of the above monomers or a copolymer of any of the above monomers and another monomer. For example, it is preferable that the acryl main chain of the graft copolymer is a copolymer obtained from an (meth)acrylic acid ester and ethylene.

At least some of the side chains bonded to the acryl main chain are side chains containing a urethane polymer unit or a urethane oligomer unit. The graft copolymer may have a plurality of urethane polymer units having different molecular weights and/or a plurality of urethane oligomer units having different molecular weights. The molecular weight of the urethane polymer unit is 3,000 to 4,000 for example. The molecular weight of the urethane oligomer unit is 350 to 600 for example. The graft copolymer may have both the side chain containing a urethane polymer unit and the side chain containing a urethane oligomer unit.

The acryl main chain may be bonded to the urethane polymer unit or the urethane oligomer unit, directly or through another linking group. Examples of another linking group include an ethylene oxide group, a polyethylene oxide group, a propylene oxide group, a polypropylene oxide group, and the like. The graft copolymer may contain a plurality of kinds of side chains in which the urethane polymer unit or the urethane oligomer unit is bonded through different linking groups (including a direct bond).

At least some of the side chains containing the urethane polymer unit or the urethane oligomer unit has an acryloyl group on the terminal thereof. Preferably, all the side chains in the graft copolymer that contain the urethane polymer unit or the urethane oligomer unit have an acryloyl group on the terminal thereof.

The graft copolymer may have other side chains in addition to the side chains containing the urethane polymer unit or the urethane oligomer unit. Examples of other side chains include a linear or branched alkyl group. As the linear or branched alkyl group, a linear alkyl group having 1 to 6 carbon atoms is preferable, a n-propyl group, an ethyl group, or a methyl group is more preferable, and a methyl group is even more preferable.

The graft copolymer may also have a structure containing a plurality of kinds of side chains different from each other in terms of the molecular weight, the linking group, and the like of the urethane polymer unit or the urethane oligomer unit and a plurality of other side chains described above.

The weight-average molecular weight of the graft copolymer is preferably equal to or greater than 10,000. Furthermore, the weight-average molecular weight of the graft copolymer is preferably 10,000 to 300,000. The molecular weight of the graft copolymer is more preferably 10,000 to 2,500,000, and even more preferably 12,000 to 200,000.

It is preferable that the weight-average molecular weight of the graft copolymer is equal to or greater than 10,000, because then the adhesiveness between the inorganic layer 16 and the protective organic layer 18 can be improved, the protective organic layer 18 having the desired thickness can be formed, the curling of the barrier film 10 can be inhibited, the viscosity of the polymerizable composition can be increased, and the thickness unevenness that occurs during drying can be inhibited.

In a case where the weight-average molecular weight of the graft copolymer is equal to or smaller than 300,000, it is possible to easily adjust a dilution factor of the polymerizable composition by appropriately maintaining the viscosity of the polymerizable composition. In addition, by reducing a drying load which means a large amount of solvent needs to be dried, it is possible to easily control the process.

In the present invention, the weight-average molecular weight (Mw) of various polymerized substances (a polymer, a resin, and a polymer material) may be measured as a molecular weight expressed in terms of polystyrene (PS) by gel permeation chromatography (GPC). More specifically, the weight-average molecular weight may be determined using HLC-8220 (manufactured by Tosoh Corporation), TSKgel Super AWM-H (manufactured by Tosoh Corporation, 6.0 mmID×15.0 cm) as a column, and a 10 mmol/L lithium bromide N-methylpyrrolidinone (NMP) solution as an eluent.

As the weight-average molecular weight of a polymer or the like, the value described in a catalog or the like may be used.

As described above, the graft copolymer is an acryl polymer having an acryloyl group-terminated urethane a side chain. The double bond equivalent (acryl equivalent) of the graft copolymer is preferably equal to or greater than 500 g/mol, more preferably equal to or greater than 550 g/mol, and even more preferably equal to or greater than 600 g/mol. The double bond equivalent is the weight-average molecular weight (polymer mass) per 1 mol of polymerizable double bonds (that is, (meth)acryloyl groups) contained in the graft copolymer.

It is preferable that the double bond equivalent of the graft copolymer is equal to or greater than 500 g/mol, because then by preventing an unnecessary increase in the crosslinking density and an increase in the internal stress that occur in a case where the amount of double bonds, that is, the amount of terminal (meth)acryloyl groups of the side chain too large, the protective organic layer 18 exhibiting excellent adhesiveness with respect to the inorganic layer 16 can be formed, and the occurrence of curling of the barrier film 10 can be prevented.

The upper limit of the double bond equivalent of the graft copolymer is not particularly limited. However, in a case where the double bond equivalent is too large, that is, in a case where the amount of the terminal (meth)acryloyl group contained in the side chain is too small, it is likely that the problems may arise such as the occurrence of cohesive peeling in the protective organic layer 18 resulting from the insufficient crosslinking in the protective organic layer 18, the deterioration of the protective function for the inorganic layer 16 resulting from the reduction in the hardness of the protective organic layer 18, and the ease of occurrence of a defect such as a scratch.

Considering the above points, the double bond equivalent of the graft copolymer is preferably equal to or smaller than 2,000 g/mol.

The double bond equivalent of the graft copolymer may be measured by known methods. Furthermore, as the double bond equivalent of the graft copolymer, the value described in a catalog or the like may be used.

The refractive index of a polymerized substance (cured substance) of the graft copolymer is preferably equal to or lower than 1.52, and more preferably equal to or lower than 1.50.

In a case where the refractive index of the polymerized substance of the graft copolymer is equal to or lower than 1.52, a gas barrier film 10 having high transparency can be obtained.

In the present invention, the refractive index of various substances such as the polymerized substance of the graft copolymer may be measured based on JIS K 7142 by using a known refractive index measuring apparatus. Examples of the refractive index measuring apparatus include a multi-wavelength Abbe refractometer DR-M2 manufactured by ATAGO CO., LTD.

Furthermore, as the refractive index, the value described in a catalog or the like may be used.

As the aforementioned graft copolymer, for example, commercial products such as an ACRIT 8BR series including ACRIT 8BR-930 manufactured by TAISEI FINE CHEMICAL CO., LTD that is an ultraviolet curable type urethane acryl polymer may be used.

Furthermore, a plurality of graft copolymers may be used in combination.

As described above, the polymerizable composition that will become the protective organic layer 18 contains a (meth)acrylate having three or more functional groups.

As the (meth)acrylate monomer having three or more functional groups, various known (meth)acrylate monomers can be used.

Specifically, examples thereof include TMPTA, DPHA, epichlorohydrin (ECH)-modified glycerol tri(meth)acrylate, ethylene oxide (EO)-modified glycerol tri(meth)acrylate, propylene oxide (PO)-modified glycerol tri(meth)acrylate, pentaerythritol triacrylate, pentaerythritol tetraacrylate, EO-modified phosphoric acid triacrylate, caprolactone-modified trimethylolpropane tri(meth)acrylate, EO-modified TMPTA, PO-modified TMPTA, tris(acryloxyethyl)isocyanurate, dipentaerythritol penta(meth)acrylate, caprolactone-modified DPHA, dipentaerythritol hydroxypenta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxytetra(meth)acrylate, pentaerythritol tetra(meth)acrylate, and the like.

In addition, in the present invention, a (meth)acrylate monomer having three or more functional groups in a compound represented by the following General Formula (1) can also be suitably used.

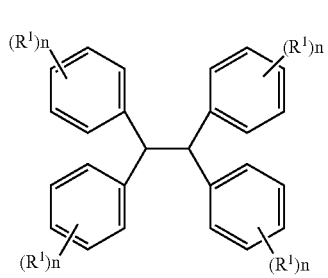

General Formula (1)

(In General Formula (1), $R^1$'s each represent a substituent and may be the same as or different from each other. n's each represent an integer of 0 to 5 and may be the same as or different from each other. Here, at least one of $R^1$'s contain a polymerizable group.)

Examples of the substituent represented by $R^1$ include a group obtained by combining one or more groups among —$CR^2_2$— ($R^2$ represents a hydrogen atom or a substituent), —CO—, —O—, a phenylene group, —S—, —C≡C—, —$NR^3$— ($R^3$ represents a hydrogen atom or a substituent), and —$CR^4$=$CR^5$— ($R^4$ and $R^5$ each represent a hydrogen atom or a substituent) with a polymerizable group. The substituent represented by $R^1$ is preferably a group obtained by combining one or more groups among —$CR^2_2$— ($R^2$ represents a hydrogen atom or a substituent), —CO—, —O—, and a phenylene group with a polymerizable group.

$R^2$ represents a hydrogen atom or a substituent, and is preferably a hydrogen atom or a hydroxy group.

It is preferable that at least one of $R^1$'s contains a hydroxy group.

The molecular weight of at least one of $R^1$'s is preferably 10 to 250, and more preferably 70 to 150.

Regarding the binding position of $R^1$, it is preferable that $R^1$ is bonded in at least para-position.

n's each represent an integer of 0 to 5. Each of n's is preferably an integer of 0 to 2, and more preferably 0 or 1. It is even more preferable that all n's are 1.

It is preferable that at least two $R^1$'s in the compound represented by General Formula (1) have the same structure. It is more preferable that all n's are 1, and at least two $R^1$'s and the other two $R^1$'s among four R's have the same structure. It is even more preferable that all n's are 1, and four $R^1$'s have the same structure. The polymerizable group included in General Formula (1) is preferably a (meth)acryloyl group or an epoxy group, and more preferably a (meth)acryloyl group. The number of polymerizable groups included in General Formula (1) is preferably equal to or greater than 2, and more preferably equal to or greater than 3. The upper limit of the number of polymerizable groups included in General Formula (I) is not particularly limited, but is preferably equal to or smaller than 8, and more preferably equal to or smaller than 6.

The molecular weight of the compound represented by General Formula (1) is preferably 600 to 1,400, and more preferably 800 to 1,200.

Specific examples of the (meth)acrylate monomer having three or more functional groups in the compound represented by General Formula (1) will be shown below, but the (meth)acrylate monomer having three or more functional groups in the compound represented by General Formula (1) is not limited thereto. Furthermore, in the following examples of the (meth)acrylate monomer having three or more functional groups, all of four n's in General Formula (1) are 1. However, examples of the (meth)acrylate monomer having three or more functional groups in the compound represented by General Formula (1) also include a compound represented by General Formula (1) in which one, two, or three n's among four n's are 0, and a compound represented by General Formula (1) in which one, two, or three or more n's among four n's are equal to or greater than 2 (a compound in which two or more $R^1$'s are bonded to one ring).

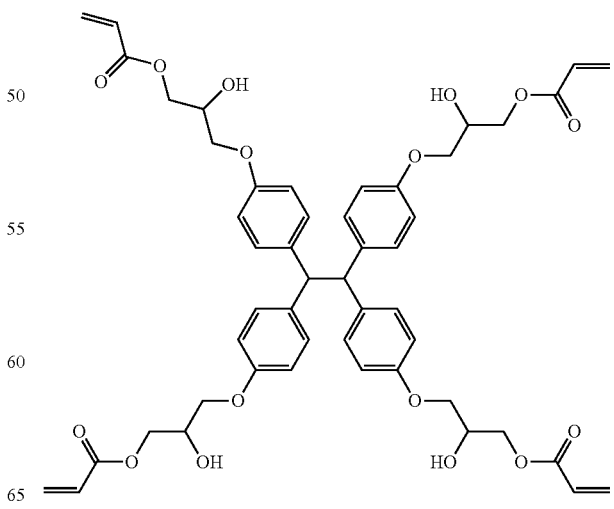

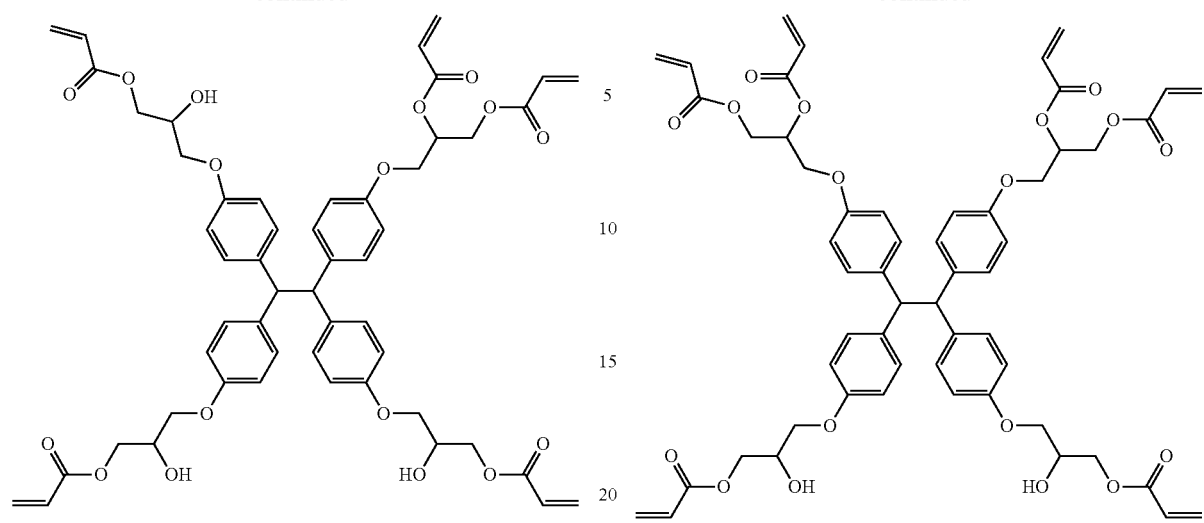
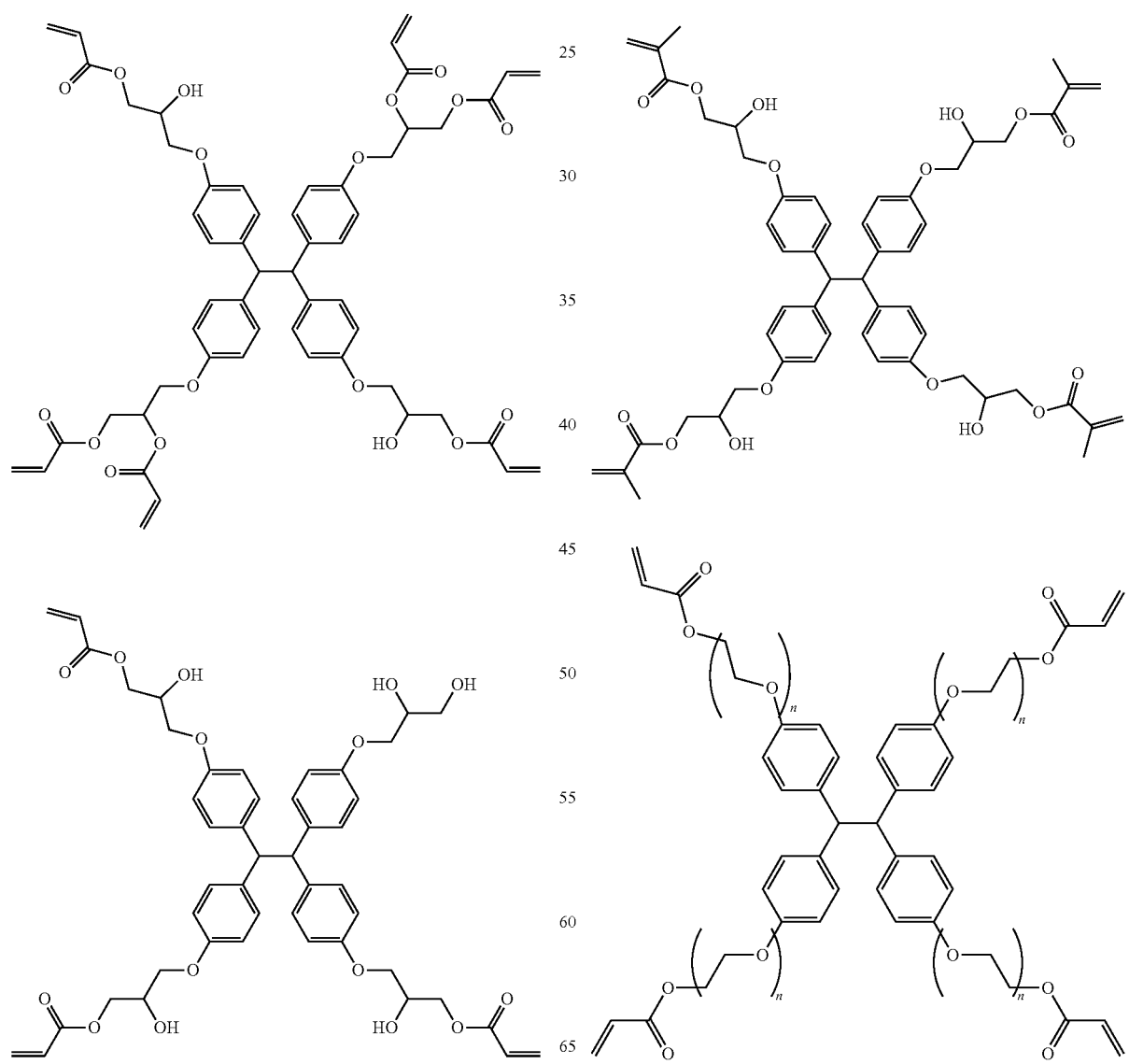

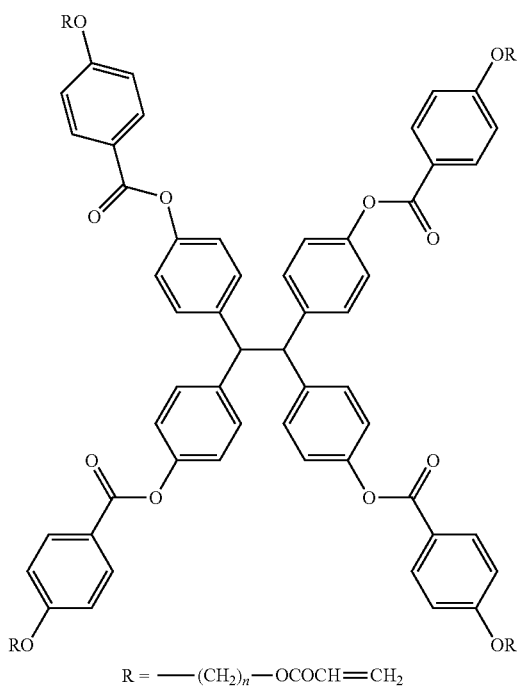
R = —(CH$_2$)$_n$—OCOCH=CH$_2$
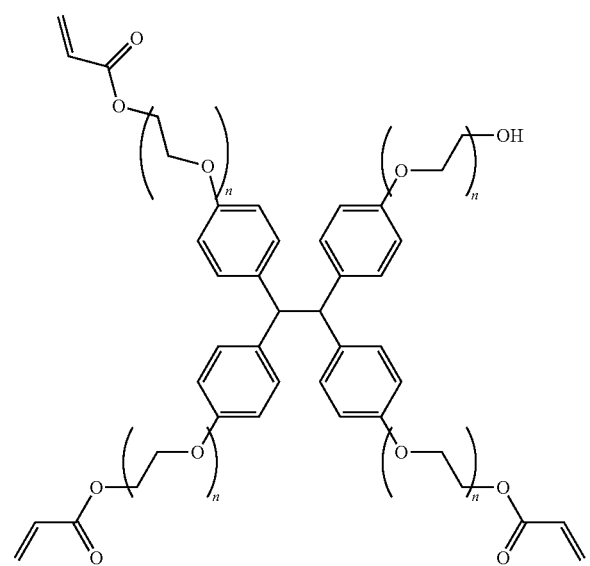
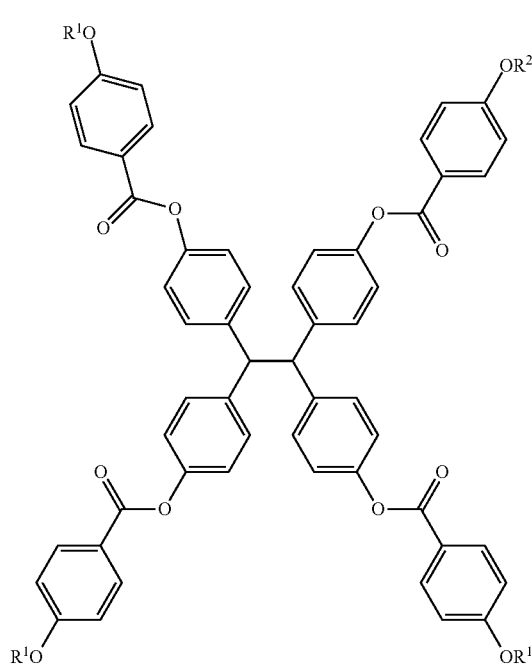
R$^1$ = —(CH$_2$)$_n$—OCOCH=CH$_2$
R$^2$ = —(CH$_2$)$_n$OH
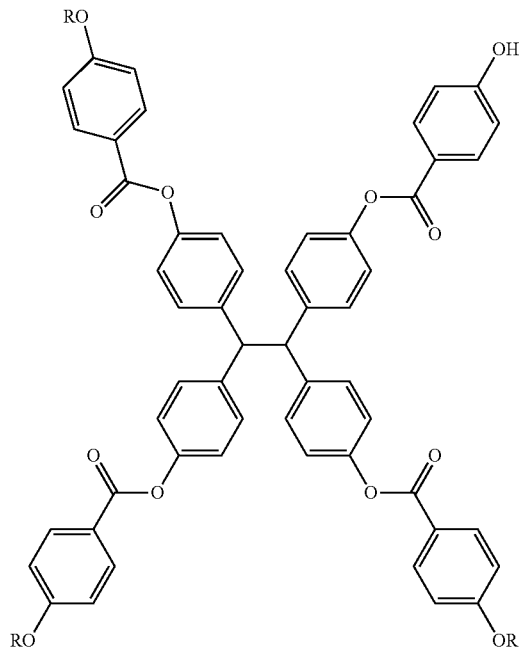
R = —(CH$_2$)$_n$—OCOCH=CH$_2$

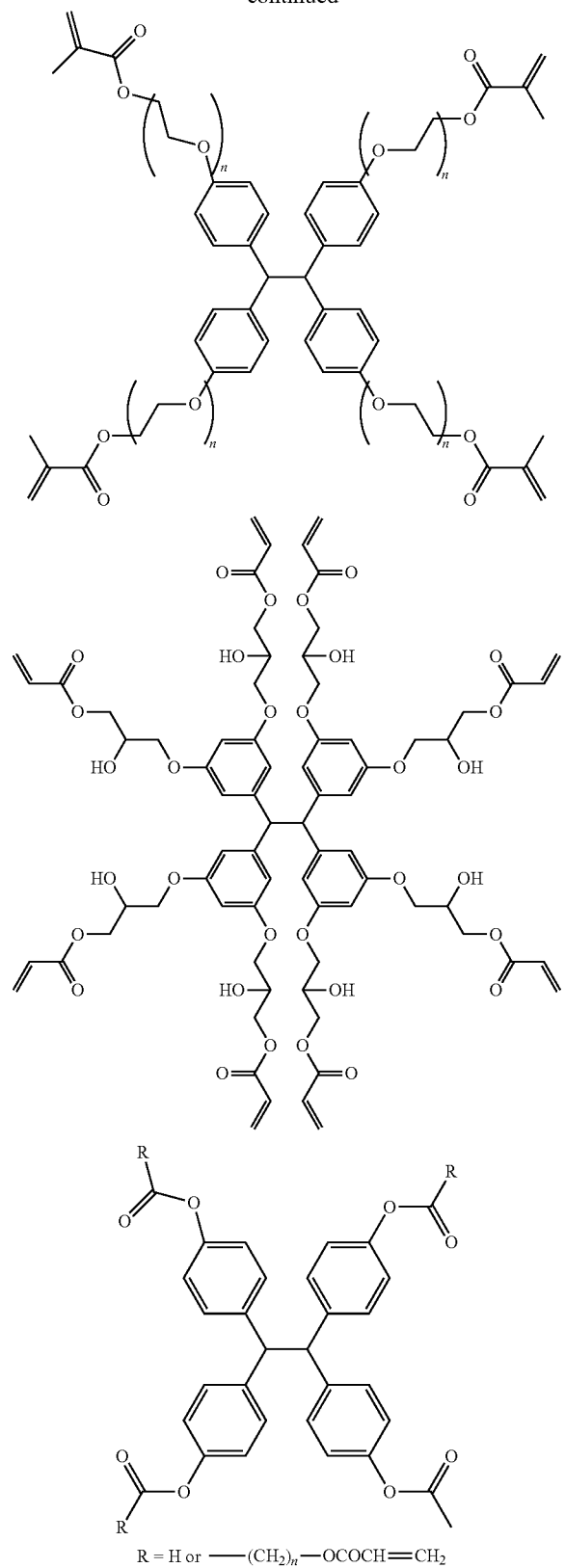

The (meth)acrylate monomer having three or more functional groups in the compound represented by General Formula (1) is available as a commercial product.

Furthermore, the (meth)acrylate monomer having three or more functional groups in the compound represented by General Formula (1) can be synthesized by known methods. At the time of synthesizing the (meth)acrylate monomer, generally, an isomer different from the intended (meth) acrylate monomer and the like are also generated. In a case where it is desired to separate the isomer, column chromatography can be used to separate the isomer.

In the present invention, among the (meth)acrylate monomers having three or more functional groups, DPHA, the (meth)acrylate monomer having three or more functional groups in the compound represented by General Formula (1), and the like are suitably used.

A plurality of (meth)acrylate monomers having three or more functional groups described above may be used in combination.

As described above, the polymerizable composition which will become the protective organic layer 18 contains a (meth)acrylate polymer.

The (meth)acrylate polymer may be an acrylate polymer, a methacrylate polymer, or a mixture of an acrylate polymer and a methacrylate polymer. Among these, in view of obtaining the protective organic layer 18 having high hardness, a methacrylate polymer is suitably used.

The molecular weight of the (meth)acrylate polymer is not particularly limited. However, the weight-average molecular weight of the (meth)acrylate polymer is preferably equal to or greater than 10,000, more preferably equal to or greater than 20,000, and particularly preferably equal to or greater than 40,000.

It is preferable that the weight-average molecular weight of the (meth)acrylate polymer is equal to or greater than 10,000, and particularly preferably equal to or greater than 20,000, because then the adhesiveness between the inorganic layer 16 and the protective organic layer 18 can be improved by inhibiting the shrinkage at the time of polymerizing (curing) the polymerizable composition.

As the (meth)acrylate polymer, commercial products can also be suitably used.

Examples of the commercial products of the (meth) acrylate polymer include a DIANAL BR series manufactured by MITSUBISHI RAYON CO., LTD., and the like.

The refractive index of a polymerized substance (cured substance) of the (meth)acrylate polymer is preferably equal to or lower than 1.52, and more preferably equal to or lower than 1.50.

In a case where the refractive index of a polymerized substance of the (meth)acrylate polymer is equal to or lower than 1.52, a gas barrier film 10 having high transparency can be obtained.

The polymerizable composition which will become the protective organic layer 18 also contains a silane coupling agent having one or more (meth)acryloyl groups.

As the silane coupling agent, various known compounds can be used as long as they have one or more (meth)acryloyl groups. Specifically, examples thereof include 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, and the like.

As the silane coupling agent having one or more (meth)acryloyl groups, commercial products can also be suitably used.

Examples of the commercial products of the silane coupling agent having one or more (meth)acryloyl groups include KBM-5103, KBM-502, KBM-503, KBE-502, and KBE-503 manufactured by Shin-Etsu Silicones, and the like.

As described above, the protective organic layer 18 has the polymerized substance of the graft copolymer, the polymerized substance of the (meth)acrylate monomer having three or more functional groups, the polymerized substance of the graft copolymer and the (meth)acrylate monomer having three or more functional groups, the (meth) acrylate polymer, and the silane coupling agent having one or more (meth)acryloyl groups.

The protective organic layer 18 is formed, for example, by preparing a polymerizable composition, which is obtained by dissolving or dispersing the graft copolymer, the (meth)acrylate monomer having three or more functional groups, the (meth)acrylate polymer, and the silane coupling agent having one or more (meth)acryloyl groups, in a solvent, coating the surface of the inorganic layer 16 with the polymerizable composition, drying the polymerizable composition, and then polymerizing (curing) the polymerizable composition by, for example, ultraviolet irradiation. The solvent to be used may be appropriately selected from solvents in which the above components can be dissolved or dispersed. Furthermore, the protective organic layer 18 is also preferably formed by RtoR.

In the polymerizable composition forming the protective organic layer 18, the content of the graft copolymer is preferably 25% to 50% by mass, and more preferably 30% to 45% by mass.

In the polymerizable composition forming the protective organic layer 18, the content of the (meth)acrylate monomer having three or more functional groups is preferably 10% to 35% by mass, and more preferably 15% to 30% by mass.

In the polymerizable composition forming the protective organic layer 18, the content of the (meth)acrylate polymer is preferably 10% to 30% by mass, and more preferably 15% to 25% by mass.

In the polymerizable composition forming the protective organic layer 18, the content of the silane coupling agent having one or more (meth)acryloyl groups is preferably 5% to 15% by mass, and more preferably 7.5% to 12.5% by mass.

In a case where the content of each of the four components in the polymerizable composition forming the protective organic layer 18 is within the above range, it is possible to form a hard and thick protective organic layer 18 which exhibits high adhesiveness with respect to the inorganic layer 16.

If necessary, a photopolymerization initiator may be added to the polymerizable composition forming the protective organic layer 18.

Various known photopolymerization initiators can be used according to the components contained in the polymerizable composition.

Specifically, examples of suitable photopolymerization initiators include commercial products such as an IRGACURE series (for example, IRGACURE 651, IRGACURE 754, IRGACURE 184, IRGACURE 2959, IRGACURE 907, IRGACURE 369, IRGACURE 379, IRGACURE 819, and the like), a DAROCURE series (for example, DAROCURE TPO, DAROCURE 1173, and the like), and QUANTACURE PDO marketed by BASF SE, and an ESACURE series (for example, ESACURE TZM, ESACURE TZT, ESACURE KT046, and the like) marketed by Lamberti S.p.A.

The amount of the photopolymerization initiator to be added may be appropriately set according to the photopolymerization initiator to be used and the like.

Specifically, the amount of the photopolymerization initiator to be added is preferably 0.5% to 5% by mass and more preferably 1% to 3% by mass, with respect to the polymerizable components in the polymerizable composition. The polymerizable components refer to the graft copolymer and the (meth)acrylate monomer having three or more functional groups.

If necessary, the protective organic layer 18 may have a polymerized substance (cured substance) of a urethane acrylate oligomer. That is, if necessary, the polymerizable composition forming the protective organic layer 18 may contain a urethane acrylate oligomer.

It is preferable that the barrier film 10 of the embodiment of the present invention is manufactured using so-called RtoR. Furthermore, as will be described later, in manufacturing the barrier film 10, after the inorganic layer 16 is formed by a vapor-phase deposition method such as plasma CVD, it is preferable to laminate a protective film on the inorganic layer 16 in a vacuum and wind up the resulting film before the inorganic layer 16 contacts a pass roller and the like. Accordingly, in this case, the protective organic layer 18 is formed after peeling the protective film.

Because the lamination of the protective film is performed in a vacuum, the protective film and the inorganic layer 16 relatively firmly adhere to each other. Therefore, in a case where the protective film is peeled to form the protective organic layer 18, the protective film is slightly transferred to the surface of the inorganic layer 16.

Generally, the protective film is formed of polyolefin such as PE.

Accordingly, in a case where the protective organic layer 18 contains a urethane acrylate oligomer which exhibits excellent adhesiveness with respect to polyolefin, the adhesiveness between the inorganic layer 16 and the protective organic layer 18 can be further improved.

As the urethane acrylate oligomer, it is possible to use various acrylate-terminated urethane oligomers which can be cured by ultraviolet rays.

In the present invention, the urethane acrylate oligomer is a urethane acrylate molecule having a molecular weight of 1,000 to 10,000. In a case where the urethane acrylate oligomer does not have a molecular weight distribution, the molecular weight means a molecular weight calculated from the chemical structural formula. In a case where the urethane acrylate oligomer has a molecular weight distribution, the molecular weight means a weight-average molecular weight described above.

As the urethane acrylate oligomer, commercial products can also be suitably used.

Examples of the commercial products of the urethane acrylate oligomer include a functional oligomer CN series manufactured by Sartomer, a photocurable oligomer NK series manufactured by SHIN-NAKAMURA CHEMICAL CO., LTD., and the like.

The refractive index of a polymerized substance (cured substance) of the urethane acrylate oligomer is preferably equal to or lower than 1.52, and more preferably equal to or lower than 1.50.

In a case where the refractive index of a polymerized substance of the urethane acrylate oligomer is equal to or lower than 1.52, a gas barrier film 10 having high transparency can be obtained.

In the polymerizable composition forming the protective organic layer 18, the content of the urethane acrylate oligomer is preferably 1% to 10% by mass, and more preferably 3% to 7% by mass.

It is preferable that the content of the urethane acrylate oligomer in the polymerizable composition is within the above range, because then the adhesiveness between the inorganic layer 16 and the protective organic layer 18 can be improved without impairing the hardness of the protective organic layer 18.

If necessary, the protective organic layer 18 may contain a lubricating agent. That is, if necessary, the polymerizable composition forming the protective organic layer 18 may contain a lubricating agent.

As described above, it is preferable that the barrier film 10 of the embodiment of the present invention is prepared by RtoR. Generally, the protective organic layer 18 is formed by a coating method. Therefore, the protective organic layer 18 has extremely high surface smoothness. Accordingly, depending on the material forming the protective organic layer 18, the films excessively firmly adhere to each other at the time of winding, and hence the films are not smoothly wound off in some cases.

In contrast, in a case where the protective organic layer 18 contains a lubricating agent, the films can be stably and smoothly wound up and wound off for performing RtoR, and the shape of the wound roll becomes beautiful.

As the lubricating agent, it is possible to use various known lubricating agents (matting agents) such as a methyl (meth)acrylate polymer, a butyl (meth)acrylate polymer, oleic acid amide, and silicon oxide particles.

Furthermore, the particle diameter of the lubricating agent may be appropriately selected according to the thickness of the protective organic layer 18 and the like. For example, particles having a diameter of about 0.4 to 3 μm are suitably used.

As the lubricating agent, commercial products can also be suitably used.

Examples of the commercial products of the lubricating agent include an MX series manufactured by Soken Chemical & Engineering Co., Ltd. and the like.

In the polymerizable composition forming the protective organic layer 18, the amount of the lubricating agent to be added may be appropriately set according to the lubricating agent to be used. For example, the amount of the lubricating agent to be added is about 0.3% to 1% by mass with respect to the solid contents of the polymerizable composition.

The thickness of the protective organic layer 18 may be appropriately set according to the material forming the protective organic layer 18 such that the protective organic layer 18 can sufficiently protect the inorganic layer 16. According to the examination performed by the inventors of the present invention, the thickness of the protective organic layer 18 is preferably 3 to 30 μm, and more preferably 5 to 15 μm.

It is preferable that the thickness of the protective organic layer 18 is equal to or greater than 3 μm, because then the inorganic layer 16 can be prevented from being damaged by external force, the support 12 can be prevented from being stretched even in a case where heat, tension, and the like are applied to the barrier film 10, and the inorganic layer 16 can be prevented from being damaged by the stretching of the support 12.

Furthermore, it is preferable that the thickness of the protective organic layer 18 is equal to or smaller than 30 μm, because then the barrier film 10 can be prevented from becoming unnecessarily thick, and a barrier film 10 having excellent flexibility and transparency can be obtained.

The pencil hardness of the protective organic layer 18 is preferably equal to or higher than H, and more preferably equal to or higher than 2H. In a case where the pencil hardness of the protective organic layer 18 is equal to or higher than H, it is possible to suitably prevent the damage of the inorganic layer 16 by protecting the inorganic layer 16 with the hard protective organic layer 18.

The pencil hardness may be measured based on JIS K 5600-5-4.

The barrier film 10 of the embodiment of the present invention has a hard protective organic layer 18 which exhibits excellent adhesiveness with respect to the inorganic layer 16 and has a sufficient thickness. Therefore, for example, even in a case where the barrier film of the embodiment of the present invention is used in a product which undergoes a step of applying pressure, heat, and the like as a manufacturing process, such as a case where the barrier film is transported in a state of being nipped by rolls like dimple rolls having asperities under a high pressure, the damage of the inorganic layer can be prevented.

The barrier film 10 of the embodiment of the present invention is suitably used in a solar cell module which undergoes a step of applying pressure, heat, and the like as a manufacturing process, and the like.

Accordingly, it is preferable that the barrier film 10 of the embodiment of the present invention has high light transmittance and a low haze.

Specifically, the haze of the barrier film 10 of the embodiment of the present invention is preferably equal to or lower than 1.5%, and more preferably equal to or lower than 1.0%. Furthermore, the total light transmittance of the barrier film 10 of the embodiment of the present invention is preferably equal to or higher than 88%, and more preferably equal to or higher than 90%.

The total light transmittance of the barrier film 10 may be measured based on JIS K 7361 by using a commercial measurement apparatus such as NDH5000 and SH-7000 manufactured by NIPPON DENSHOKU INDUSTRIES Co., LTD.

Furthermore, the haze of the barrier film 10 may be measured based on JIS K 7136 by using a commercial measurement apparatus such as NDH5000 manufactured by NIPPON DENSHOKU INDUSTRIES Co., LTD.

The thermal shrinkage rate of the barrier film 10 of the embodiment of the present invention is preferably equal to or lower than 2%, and more preferably equal to or lower than 1.5%.

As described above, in a case where the inorganic layer 16 in the barrier film 10 is damaged, and hence the support 12 is stretched due to heat, the tension applied to the gas barrier film 10, and the like, for example, a phenomenon occurs in which peeling (shear fracture) is caused between the support 12 and the undercoat organic layer 14, and hence the inorganic layer 16 as the upper layer is also broken.

In contrast, in a case where the thermal shrinkage rate of the barrier film 10 is equal to or lower than 2%, even in a case where the barrier film 10 is used in a product which undergoes a step of applying pressure, heat, and the like as a manufacturing process, it is possible to prevent the support 12 from being stretched and to prevent the inorganic layer 16 from being damaged by the stretching of the support 12.

The thermal shrinkage rate of the barrier film 10 may be measured as below.

First, the barrier film 10 as a measurement target of a thermal shrinkage rate is cut in 250 mm (measurement direction)×50 mm (width), thereby preparing a sample.

The prepared sample is perforated such that two holes are made at an interval of 200 mm, and then humidified by being left in an environment with a temperature of 25° C. and a relative humidity of 60% RH for 12 hours. After the humidification, the interval between the two holes in the sample is measured using a pin gauge, and the measured length is named L1.

After L1 is measured, the sample is heated to a temperature of 150° C. for 30 minutes.

After being heated for 30 minutes, the sample is humidified again by being left in an environment with a temperature of 25° C. and a relative humidity of 60% RH for 12 hours. After the humidification, the interval between the two holes in the sample is measured again by using a pin gauge, and the measured length is named L2.

By the following formula, the thermal shrinkage rate [%] of the barrier film 10 as a measurement target is determined.

Thermal shrinkage rate [%]=100×[(L2−L1)/L1]

The barrier film 10 whose thermal shrinkage rate is equal to or lower than 2% can be obtained by performing a heat treatment (annealing) on the support 12 before the manufacturing of the barrier film 10 such that the thermal shrinkage of the support 12 is saturated.

As another example of the suitable method for making the thermal shrinkage rate of the barrier film 10 equal to or lower than 2%, there is a method in which in the manufacturing of the barrier film 10 that will be described later, at the time of forming the undercoat organic layer 14 and/or at the time of forming the protective organic layer 18, the composition forming each of these layers is dried at a temperature equal to or higher than 100° C. According to this method, a heat treatment step does not need to be additionally performed. Therefore, in view of the number of production steps, the productivity, the production cost, and the like, this method is advantageous.

Hereinafter, an example of the manufacturing method of a gas barrier film of an embodiment of the present invention will be described with reference to the conceptual views in FIG. 2 and FIG. 3.

Figure 2:
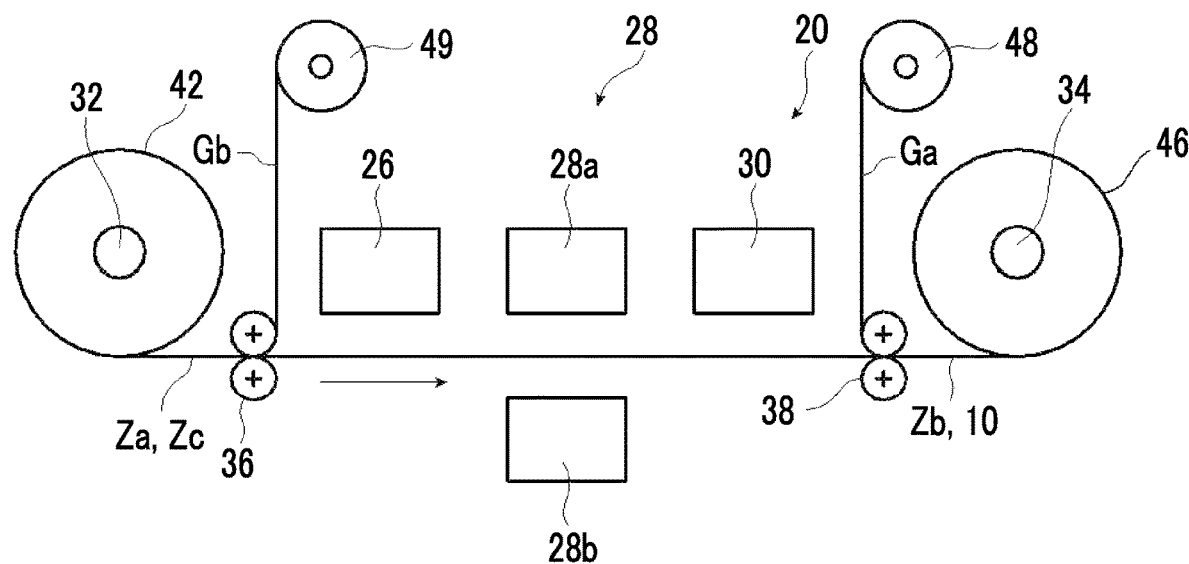
FIG. 2 is a view conceptually showing an example of an organic deposition apparatus for manufacturing the gas barrier film of the embodiment of the present invention.

The apparatus shown in FIG. 2 is an organic deposition apparatus 20 forming an organic layer. The organic deposition apparatus 20 forms an organic layer by RtoR. In this apparatus, in a state where a long material Za for deposition is being transported in the longitudinal direction, the material Za for deposition is coated with the polymerizable composition which will become an organic layer, and the polymerizable composition is dried. Then, the organic compound contained in the polymerizable composition is polymerized (cured) by light irradiation, thereby forming the undercoat organic layer 14 and the protective organic layer 18.

The organic deposition apparatus 20 shown in the drawing has, for example, a coating portion 26, a drying portion 28, a light irradiation portion 30, a rotation shaft 32, a winding-up shaft 34, and transport roller pairs 36 and 38.

Figure 3:
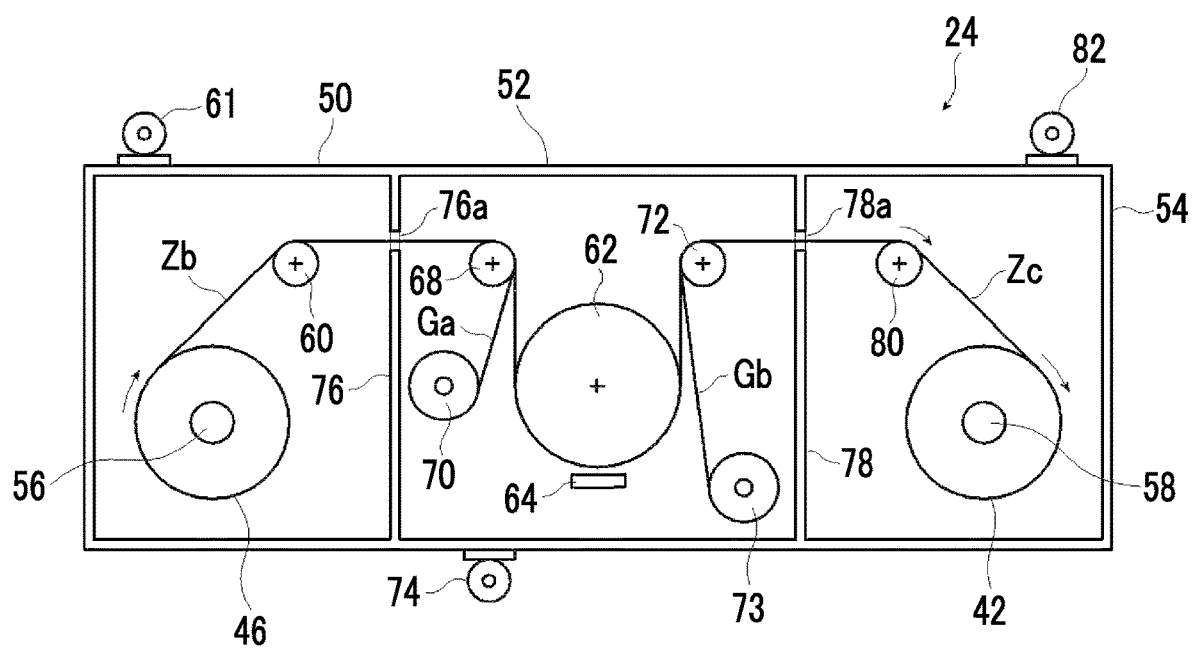
FIG. 3 is a view conceptually showing an example of an inorganic deposition apparatus for manufacturing the gas barrier film of the embodiment of the present invention.

The apparatus shown in FIG. 3 is an inorganic deposition apparatus 24 forming the inorganic layer 16. The inorganic deposition apparatus 24 also forms the inorganic layer 16 by RtoR. In this apparatus, in a state where a long material Zb for deposition, on which the undercoat organic layer 14 is formed, is being transported in the longitudinal direction, the inorganic layer 16 is formed on the undercoat organic layer 14 on the material Zb for deposition.

The inorganic deposition apparatus 24 shown in the drawing has a feeding chamber 50, a deposition chamber 52, and a winding-up chamber 54. The feeding chamber 50 and the deposition chamber 52 are separated by a partition 76 having an opening 76a, and the deposition chamber 52 and the winding-up chamber 54 are separated by a partition 78 having an opening 78a.

At the time of preparing the barrier film 10, first, a support roll prepared by winding the long support 12 which will become the material Za for deposition is loaded as a material roll 42 on the rotation shaft 32, and the undercoat organic layer 14 is formed on the surface of the support 12.

After the material roll 42 is loaded on the rotation shaft 32, the support 12 is wound off from the material roll 42 and moves along a predetermined transport path in which the support 12 passes through the transport roller pair 36, the coating portion 26, the drying portion 28, the light irradiation portion 30, and the transport roller pair 38, and reaches the winding-up shaft 34.

The material Za for deposition (support 12) wound off from the material roll 42 is transported to the coating portion 26 by the transport roller pair 36, and the surface of the material Za for deposition is coated with the polymerizable composition which will become the undercoat organic layer 14.

As described above, the coating composition which will become the undercoat organic layer 14 contains an organic solvent, an organic compound (a monomer, a dimer, a trimer, an oligomer, a polymer, or the like) which will become the undercoat organic layer 14, a surfactant, a silane coupling agent, and the like.

For the coating with the polymerizable composition in the coating portion 26, it is possible to use various known coating methods such as a die coating method, a dip coating method, an air knife coating method, a curtain coating method, a roller coating method, a wire bar coating method, and a gravure coating method.

The material Za for deposition coated with the polymerizable composition which will become the undercoat organic layer 14 is then heated by the drying portion 28. As a result, the organic solvent is removed, and the polymerizable composition is dried.

The drying portion 28 has a drying portion 28a which dries the polymerizable composition by heating the support 12 from the front surface side (polymerizable composition side (surface on which the undercoat organic layer 14 and the like are formed)) thereof and a drying portion 28b which dries the polymerizable composition by heating the support 12 from the rear surface side thereof. The drying portion dries the polymerizable composition from both the front surface side and the rear surface side.

The heating in the drying portion 28 may be performed by a known method for heating a sheet-like substance. For example, the drying portion 28a for the front surface side is a hot air drying portion, and the drying portion 28b for the rear surface side is a heating roller (pass roller having a heating mechanism).

In the manufacturing method of the embodiment of the present invention, the drying (drying step) of the polymerizable composition in the drying portion 28 is performed at a temperature equal to or higher than 100° C. Specifically, the drying in the drying portion 28 is performed such that at least either the temperature of the rear surface of the support 12 or the temperature of the polymerizable composition becomes equal to or higher than 100° C.

In a case where the polymerizable composition is dried at a temperature equal to or higher than 100° C. during the formation of the undercoat organic layer 14 as described above, by performing a heat treatment on the support 12, the thermal shrinkage of the support 12 can be saturated. As a result, the thermal shrinkage rate of the barrier film 10 can become equal to or lower than 2%, and hence the support 12 can be prevented from being stretched even in a case where the barrier film 10 is used in a product which undergoes a step of applying pressure, heat, and the like as a manufacturing process. Consequently, the damage of the inorganic layer 16 resulting from the stretching of the support 12 can be prevented.

The material Za for deposition on which the polymerizable composition, which will become the undercoat organic layer 14, is dried is then irradiated with ultraviolet rays and the like by the light irradiation portion 30. As a result, the organic compound is polymerized (crosslinked), and the undercoat organic layer 14 is formed. If necessary, the organic compound which will become the undercoat organic layer 14 and/or the protective organic layer 18 may be cured in an inert atmosphere such as a nitrogen atmosphere.

The material Za for deposition on which the undercoat organic layer 14 is formed is transported by the transport roller pair 38, and wound in the form of a roll by the winding-up shaft 34. In the organic deposition apparatus 20, in the transport roller pair 38, a protective film Ga wound off from the feeding roll 48 is laminated on the undercoat organic layer 14 and protect the undercoat organic layer 14.

After the formation of the undercoat organic layer 14 having a predetermined length is finished, if necessary, cutting is performed. Then, as a material roll 46 prepared by winding the material Zb for deposition on which the undercoat organic layer 14 is formed, the film is fed into the inorganic deposition apparatus 24 shown in FIG. 3 and used for forming the inorganic layer 16.

In the inorganic deposition apparatus 24, the material roll 46 is loaded on the rotation shaft 56 in the feeding chamber 50.

After the material roll 46 is loaded on the rotation shaft 56, the material Zb for deposition (support 12 on which the undercoat organic layer 14 is formed) is wound off and moves along a predetermined path in which the material Zb for deposition leaves the feeding chamber 50, passes through the deposition chamber 52, and reaches the winding-up shaft 58 in the winding-up chamber 54.

After the material Zb for deposition passes through the predetermined path, vacuum evacuation means 61 in the feeding chamber 50, vacuum evacuation means 74 in the deposition chamber 52, and vacuum evacuation means 82 in the winding-up chamber 54 are driven such that the internal pressure of the inorganic deposition apparatus 24 becomes a predetermined pressure.

The material Zb for deposition wound off from the material roll 46 is transported to the deposition chamber 52 with the guidance of a pass roller 60.

The material Zb for deposition transported to the deposition chamber 52 is wound around a drum 62 with the guidance of a pass roller 68 and transported along a predetermined path by being supported on the drum 62. In this state, by deposition means 64, the inorganic layer 16 is formed, for example, by CCP-CVD. At the time of forming the inorganic layer 16, before the formation of the inorganic layer 16, the protective film Ga laminated on the undercoat organic layer 14 is peeled in the pass roller 68 and recovered by a recovery roll 70.

As described above, the inorganic layer 16 may be formed by a known vapor-phase deposition method, such as plasma CVD like CCP-CVD and ICP-CVD, sputtering such as magnetron sputtering and reactive sputtering, or vacuum vapor deposition, according to the inorganic layer 16 to be formed. Therefore, the process gas to be used, the deposition condition, and the like may be appropriately set and selected according to the inorganic layer 16 to be formed, the film thickness of the inorganic layer 16, and the like.

The material Zb for deposition on which the inorganic layer 16 is formed is transported to the winding-up chamber 54 with the guidance of a pass roller 72. In the inorganic deposition apparatus 24, a protective film Gb wound off from the feeding roll 73 is laminated on the inorganic layer 16 in the pass roller 72 and protects the inorganic layer 16.

After the formation of the inorganic layer 16 is finished, dry air that is cleaned is introduced into all the chambers of the inorganic deposition apparatus 24 and released into the atmosphere. Then, if necessary, cutting is performed, and as the material roll 42 prepared by winding a material Zc for deposition on which the inorganic layer 16 is formed, the film is taken out of the winding-up chamber 54 of the inorganic deposition apparatus 24.

In a case where a plurality of combinations of the undercoat organic layer 14 and the inorganic layer 16 are formed as described above, the formation of the undercoat organic layer 14 and the inorganic layer 16 may be repeated according to the number of combinations of the undercoat organic layer 14 and the inorganic layer 16 to be formed.

The material roll 42 prepared by winding the material Zc for deposition on which the inorganic layer 16 is formed (support 12 on which the undercoat organic layer 14 and the inorganic layer 16 are formed) is fed again into the organic deposition apparatus 20 so as to form the protective organic layer 18.

The material roll 42 prepared by winding the material Zc for deposition is loaded on the rotation shaft 32 as in the formation of the undercoat organic layer 14 described above, and the material Zc for deposition is wound off and moves along a predetermined transport path reaching the winding-up shaft 34.

As in the formation of the undercoat organic layer 14, in the organic deposition apparatus 20, the material Zc for deposition (support 12 on which the undercoat organic layer 14 and the inorganic layer 16 are formed) is transported in the longitudinal direction. In this state, in the coating portion 26, the inorganic layer 16 is coated with the polymerizable composition which will become the protective organic layer 18. In a case where the protective organic layer 18 (undercoat organic layer 14) is formed on the inorganic layer 16, before the coating with the polymerizable composition, the protective film Gb laminated on the inorganic layer 16 is peeled in the transport roller pair 36 and recovered by a recovery roll 49.

As described above, the polymerizable composition which will become the protective organic layer 18 is prepared by dissolving or dispersing the graft copolymer, the (meth)acrylate monomer having three or more functional groups, the (meth)acrylate polymer, and the silane coupling agent having one or more (meth)acryloyl groups in a solvent.

As in the formation of the undercoat organic layer 14, in the formation of the protective organic layer 18, the drying (drying step) of the polymerizable composition in the drying portion 28 is also performed at a temperature equal to or higher than 100° C. Specifically, in the drying portion 28, as described above, the drying is performed such that at least either the surface temperature of the support 12 or the temperature of the polymerizable composition becomes equal to or higher than 100° C.

As described above, in the formation of the protective organic layer 18, by drying the polymerizable composition at a temperature equal to or higher than 100° C., the thermal shrinkage of the support 12 can be saturated. As a result, the thermal shrinkage rate of the barrier film 10 can become equal to or lower than 2%, and accordingly, it is possible to prevent the damage of the inorganic layer 16 resulting from the stretching of the support 12 in the step of applying pressure, heat, and the like as a manufacturing process.

The material Za for deposition on which the polymerizable composition which will become the protective organic layer 18 is dried is then irradiated with ultraviolet rays or the like by the light irradiation portion 30. As a result, the organic compounds (the graft copolymer and the acrylate monomer) are polymerized (crosslinked) and cured, and the protective organic layer 18 is formed.

The material Zc for deposition on which the protective organic layer 18 is formed, that is, the gas barrier film 10 is wound up in the form of a roll by the winding-up shaft 34.

In the above example, in both the formation of the undercoat organic layer 14 and the formation of the protective organic layer 18, the polymerizable composition was dried at a temperature equal to or higher than 100° C. However, the present invention is not limited thereto. For example, the polymerizable composition may be dried at a temperature equal to or higher than 100° C. only in the formation of the undercoat organic layer 14 or only in the formation of the protective organic layer 18.

Furthermore, in a case where a plurality of combinations of the undercoat organic layer 14 and the inorganic layer 16 are formed as described above, in the formation of all the undercoat organic layers 14, the polymerizable composition may be dried at a temperature equal to or higher than 100° C. Alternatively, the polymerizable composition may be dried at a temperature equal to or higher than 100° C. only in the formation of one undercoat organic layer 14, or the polymerizable composition may be dried at a temperature equal to or higher than 100° C. in the formation of two or more undercoat organic layers 14.

That is, in the manufacturing method of the embodiment of the present invention, in the formation of the protective organic layer 18 or in the formation of the protective organic layer 18 and the undercoat organic layer 14, the polymerizable composition may be dried at a temperature equal to or higher than 100° C. at the time of forming at least one organic layer.

In a case where a functional layer such as an easily adhesive layer, a lubricating layer, or a firm adhesive layer is formed on the rear surface of the support 12 (the rear surface of the support 12 and/or the surface on which the undercoat organic layer 14 and the like are formed) in the manufacturing method of the embodiment of the present invention, the timing of forming the functional layer is not limited. That is, the timing of performing a step of forming the functional layer is not limited.

Accordingly, for example, the functional layer may be formed on a surface which will become the rear surface of the support 12, and then the undercoat organic layer 14, the inorganic layer 16, and the protective organic layer 18 may be formed on the opposite surface of the support 12. Alternatively, the undercoat organic layer 14 may be formed on one surface of the support 12, the functional layer may be then formed on the rear surface of the support 12, and then the inorganic layer 16 and the protective organic layer 18 may be formed. As another option, the undercoat organic layer 14, the inorganic layer 16, and the protective organic layer 18 may be formed on one surface of the support 12, and then the functional layer may be formed on the rear surface of the support 12.

As described above, the functional layer may be formed by known methods such as a coating method according to the material forming the functional layer.

For example, in a case where a firm adhesive layer is formed as the functional layer, as in the formation of the undercoat organic layer 14 and the protective organic layer 18, the firm adhesive layer may be formed by preparing a polymerizable composition, which contains a binder becoming an easily adhesive layer and lubricating particles (matting agent) and necessary components such as a surfactant and a crosslinking agent, performing coating with the polymerizable composition in the coating portion 26, and drying the polymerizable composition in the drying portion 28 or additionally performing light irradiation (curing by curing means) in the light irradiation portion 30.

Figure 4:
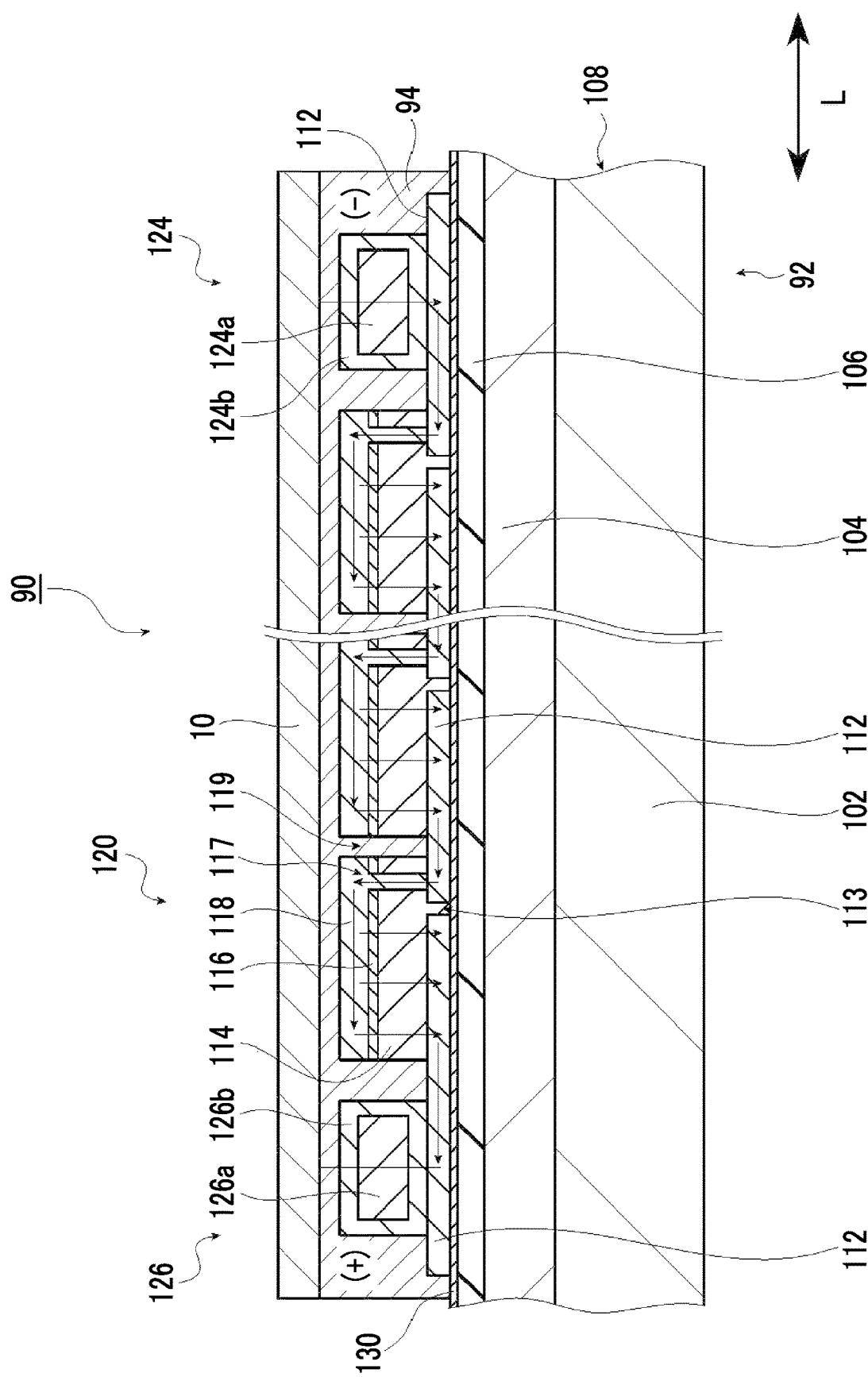
FIG. 4 is a view conceptually showing an example of a solar cell of an embodiment of the present invention.

FIG. 4 conceptually shows an example of a solar cell module as a solar cell of the embodiment of the present invention in which the gas barrier film of the embodiment of the present invention is used.

A solar cell module 90 shown in FIG. 4 is obtained by providing a bonding layer 94 on a solar battery cell 120 side of a module body 92, and bonding the barrier film 10 of the embodiment of the present invention to the bonding layer 94 such that the module body 92 (solar battery cell) is sealed with the barrier film 10.

In the solar cell module 90 shown in FIG. 1, the module body 92 is a module-type solar cell obtained by joining a plurality of solar battery cells (thin film solar cells) 120, which are each constituted with a lower electrode 112, a photoelectric conversion layer 114, a buffer layer 116, and an upper electrode 118, in series on an insulating metal substrate 108 having a metal substrate 102, an Al layer 104, and an insulating layer 106. On the lower electrodes 112 at both ends in the arrangement direction of the solar battery cells 120, first conductive member 124 and a second conductive member 126 are formed which are for taking out the electric power generated by the solar battery cells 120 directly joined with each other to the outside.

In the solar cell module 90, the insulating metal substrate 108 has an aluminum (Al) anodized film as the insulating layer 106. It is preferable that the insulating metal substrate 108 is constituted with the metal substrate 102, the Al layer 104, and the insulating layer 106.

In the following description, "insulating metal substrate 108" will be simply referred to as "substrate 108" as well.

The substrate used in the present invention is not limited to substrates having such a metal substrate 102. For example, the substrate used in the present invention may be constituted only with the Al layer 104 and the insulating layer 106 without the metal substrate 102. That is, in the present invention, it is possible to use substrates having various constitutions as long as they are plate materials having Al on the surface thereof.

As the metal substrate 102, various metal materials can be used without particular limitation. It is preferable to use the materials having a coefficient of thermal expansion (coefficient of linear thermal expansion) close to that of the photoelectric conversion layer 114 that will be described later, particularly, the materials having a coefficient of thermal expansion close to that of a CIGS-based compound such as CIGS.

In the following description, "metal substrate 102" will be simply referred to as "substrate 102" as well.

Considering the aforementioned points, examples of materials suitable as the substrate 102 include austenite-based stainless steel (coefficient of linear expansion: $17 \times 10^{-6}$/° C.), carbon steel (coefficient of linear expansion: $10.8 \times 10^{-6}$/° C.), ferrite-based stainless steel (coefficient of linear expansion: $10.5 \times 10^{-6}$/° C.), Invar alloy 42 (coefficient of linear expansion: $5 \times 10^{-6}$1° C.), a Kovar alloy (coefficient of linear expansion: $5\times10^{-6}/°$ C.), Invar alloy 36 (coefficient of linear expansion: $<1\times10^{-6}/°$ C.), Ti (coefficient of linear expansion: $9.2\times10^{-6}/°$ C.), and the like. Among these, stainless steel is particularly suitable.

The thickness of the substrate 102 is not particularly limited, and may be appropriately set according to the manufacturing process of the solar cell module 90 (semiconductor device) and the handleability (hardness and flexibility) required at the time of operation.

The surface of the substrate 102 is provided with the Al layer 104.

The Al layer 104 is a layer containing Al as a main component, and various materials such as Al and an Al alloy can be used. Particularly, it is preferable that the Al layer 104 is formed of Al containing a small amount of impurities and has a purity equal to or higher than 99% by mass. As Al having such a purity, for example, 99.99% by mass Al, 99.96% by mass Al, 99.9% by mass Al, 99.85% by mass Al, 99.7% by mass Al, 99.5% by mass Al, and the like are preferable.

In the substrate 108, the insulating layer 106 obtained by the anodization of Al is formed on the surface of the Al layer 104 formed on the substrate 102.

In a case where an anodized film of Al formed on the surface of Al is heated to a temperature equal to or higher than 120° C., the anodized film of Al cracks. It is considered that because the coefficient of linear expansion of Al is higher than the coefficient of linear expansion of the anodized film, the anodized film on the Al layer cracks.

Therefore, in a solar cell in which a substrate having an insulating layer obtained by the anodization of the surface of an Al material is used, at the time of depositing a photoelectric conversion layer formed of a compound semiconductor requiring a deposition temperature equal to or higher than 500° C., cracking, peeling, and the like occur in the insulating layer due to heating, and accordingly, sufficient insulating performance is not obtained.

In contrast, in the substrate 108 shown in the drawing, the hardness and the coefficient of linear expansion of the whole substrate depend on the substrate 102. Furthermore, by the intervention of the Al layer 104 whose Young's modulus is lower than that of the substrate 102 and the insulating layer 106, the stress resulting from the minute difference in the thermal expansion between the substrate 102 and the insulating layer 106 which is an anodized film of Al is absorbed. As a result, the cracking of the insulating layer 106, that is, the anodized film of Al resulting from the difference in the coefficient of linear expansion can be inhibited.

The proof stress of Al is equal to or higher than 300 MPa at room temperature. However, at 500° C., the proof stress is reduced and becomes equal to or lower than 1/20 of the proof stress at room temperature. In contrast, even at 500° C., the proof stress of stainless steel or the like is kept at a level that is about 70% of the proof stress at room temperature. Accordingly, the limit of elastic stress and the thermal expansion of the substrate 108 at a high temperature are under the control of the substrate 102. That is, by constituting the substrate 108 with a combination of the Al layer 104 and the substrate 102, even though the substrate is exposed to high heat equal to or higher than 500° C., sufficient stiffness of the substrate 108 can be secured. Furthermore, even in a case where a manufacturing process at a high temperature equal to or higher than 500° C. is performed, because sufficient stiffness of the substrate can be secured, the restriction on handling and the like during manufacturing can be removed.

The thickness of the Al layer is not particularly limited.

In a case where the Al layer 104 is too thin, a sufficient stress relaxation effect is not obtained, and the insulating layer 106 is likely to directly contact the substrate 102. Inversely, in a case where the Al layer 104 is too thick, serious warping is likely to remain in a case where the Al layer goes through a thermal history at a high temperature, and hence the following manufacturing process is likely to be disrupted. Furthermore, in view of the material cost, an excessively thick Al layer 104 is disadvantageous.

Considering the above points, the thickness of the Al layer is preferably 5 to 150 µm, more preferably 10 to 100 µm, and particularly preferably 20 to 50 µm.

The insulating layer 106 is formed on (surface opposite to the substrate 102) of the Al layer 104. The insulating layer 106 is an anodized film of Al formed by the anodization of the surface of the Al layer 104.

As the insulating layer 106, various films obtained by the anodization of Al can be used, but it is preferable to use a porous anodized film obtained using an acidic electrolytic solution. The anodized film is an oxidized alumina film including pores having a size of tens of nanometers. Owing to its low Young's modulus, the anodized oxide film exhibits high bending resistance and is highly resistant to cracking which occurs due to the difference in thermal expansion at a high temperature.

The thickness of the insulating layer 106 is preferably equal to or greater than 2 µm, and more preferably equal to or greater than 5 µm. It is not desirable that the insulating layer 106 is excessively thick, because the flexibility is reduced, and the cost and time required for forming the insulating layer 106 are increased. Practically, the thickness of the insulating layer 106 is equal to or smaller than 50 µm at most, and preferably equal to or smaller than 30 µm. Therefore, the thickness of the insulating layer 106 is preferably 2 to 50 µm.

Because all of the substrate 102, the Al layer 104, and the insulating layer 106 have flexibility, the whole substrate 108 has flexibility. As a result, for example, by a Roll to Roll method, the lower electrode 112, the photoelectric conversion layer 114, the upper electrode 118, and the like can be formed on the insulating layer 106 side of the substrate 108.

For the module body 92, a solar cell structure may be prepared by continuously forming a plurality of layers during a single session in which the film is wound off from a roll and then wound up. Alternatively, a solar cell structure may be formed by performing steps of winding off a roll, forming a film, and winding up plural times.

The solar cell module 90 is a solar cell module (module-type solar cell) obtained by joining in series a plurality of solar battery cells (thin film solar cells) 120 each including the photoelectric conversion layer 114, the buffer layer 116, and the upper electrode 118.

On the lower electrode 112 at both ends in the arrangement direction, the first conductive member 124 and the second conductive member 126 are formed.

In the example shown in the drawing, as a preferable aspect, an alkali supply layer 130 is between the insulating layer 106 (substrate 108) and the lower electrode 112.

It is known that in a case where an alkali metal (particularly, Na) is diffused in the photoelectric conversion layer 114 formed of CIGS or the like, a photoelectric conversion efficiency increases. The alkali supply layer 130 is a layer for supplying an alkali metal to the photoelectric conversion layer 114, and is a layer of a compound containing an alkali metal. In a case where the solar cell module has the alkali supply layer 130, at the time of depositing the photoelectric conversion layer 114, the alkali metal is diffused in the photoelectric conversion layer 114 through the lower electrode 112, and hence the conversion efficiency of the photoelectric conversion layer 114 can be improved.

As the alkali supply layer 130, various layers containing an alkali metal-containing compound (composition containing an alkali metal compound) as a main component, such as $Na_2O$, $Na_2S$, $Na_2Se$, NaCl, NaF, and sodium molybdate, can be used without limitation. Particularly, a compound which contains $SiO_2$ (silicon oxide) as a main component and also contains $Na_2O$ (sodium oxide) is preferable.

As the method for depositing the alkali supply layer 130, various known methods can be used without particular limitation. Examples thereof include a vapor-phase deposition method such as sputtering or CVD and a liquid deposition method such as a sol-gel method.

In the solar cell module 90, the lower electrodes 112 are arranged and formed on the alkali supply layer 130 while leaving a predetermined gap 113 between the adjacent lower electrodes 112. Furthermore, on each of the lower electrodes 112, the photoelectric conversion layer 114 is formed such that the gap 113 between the lower electrodes 112 is buried in the photoelectric conversion layer 114. On the surface of the photoelectric conversion layer 114, the buffer layer 116 is formed.

The photoelectric conversion layer 114 and the buffer layer 116 are arranged on the lower electrodes 112 while leaving a predetermined gap 117 therebetween. The gap 113 between the lower electrodes 112 and the gap 117 between the photoelectric conversion layers 114 (buffer layers 116) are formed in different positions in the arrangement direction of the solar battery cells 120.

Furthermore, on the surface of each of the buffer layers 116, the upper electrode 118 is formed such that the gap 117 between the photoelectric conversion layers 114 (buffer layers 116) is buried.

The upper electrode 118, the buffer layer 116, and the photoelectric conversion layer 114 are arranged while leaving a predetermined gap 119 therebetween. The gap 119 is provided in a position different from the positions of the gap between the lower electrodes 112 and the gap between the photoelectric conversion layers 114 (buffer layers 116).

In the solar cell module 90, the solar battery cells 120 are electrically connected to each other in series in the longitudinal direction (direction of the arrow L) of the substrate 108 by the lower electrode 112 and the upper electrode 118.

The lower electrode 112 is constituted with, for example, a Mo electrode. The photoelectric conversion layer 114 is constituted with a compound semiconductor having a photoelectric conversion function, such as a CIGS layer. The buffer layer 116 is constituted with, for example, CdS. The upper electrode 118 is constituted with, for example, ZnO.

The solar battery cell 120 is formed in a state of extending lengthwise in the width direction orthogonal to the longitudinal direction L of the substrate 108. Therefore, the lower electrode 112 and the like also extend lengthwise in the width direction of the substrate 108.

As shown in FIG. 4, the first conductive member 124 is connected to the top of the lower electrode 112 on the extreme right. The first conductive member 124 is a member for taking out power from a negative electrode, which will be described later, to the outside.

The first conductive member 124 is, for example, a long and thin belt-like member, extends approximately in the form of a straight line along the width direction of the substrate 108, and is connected to the top of the lower electrode 112 on the extreme right. Furthermore, as shown in FIG. 1, the first conductive member 124 is constituted with a copper ribbon 124a coated with a coating material 124b of an indium copper alloy. The first conductive member 124 is connected to the lower electrode 112 by, for example, ultrasonic soldering.

Meanwhile, the second conductive member 126 is formed on the lower electrode 112 on the extreme left.

The second conductive member 126 is a member for taking out the power from a positive electrode, which will be described later, to the outside. Just like the first conductive member 124, the second conductive member 126 is a long and thin belt-like member, extends approximately in the form of a straight line along the width direction of the substrate 108, and is connected to the lower electrode 112 on the extreme left.

The second conductive member 126 has the same constitution as that of the first conductive member 124. For example, the second conductive member 126 is constituted with a copper ribbon 126a coated with a coating material 126b of an indium copper alloy.

In the solar cell module 90, the light which comes into the solar battery cell 120 from the upper electrode 118 side passes through the upper electrode 118 and the buffer layer 116. As a result, electromotive force is generated in the photoelectric conversion layer 114, and for example, an electric current flowing to the lower electrode 112 from the upper electrode 118 is generated. The arrow shown in FIG. 4 represents the direction of the electric current. The movement direction of electrons is opposite to the direction of electric currents. Therefore, in the module body 92 in FIG. 4, the lower electrode 112 on the extreme left becomes a positive electrode (plus electrode), and the lower electrode 112 on the extreme right becomes a negative electrode (minus electrode).

In the solar cell module 90, the electric power generated by the solar battery cell 120 can be taken from the first conductive member 124 and the second conductive member 126 to the outside the solar cell module 90.

The polarity of the first conductive member 124 and the polarity of the second conductive member 126 may be reversed, and are appropriately changed according to the constitution of the solar battery cell 120, the constitution of the solar cell module 90, and the like.

In the example shown in the drawing, the solar battery cells 120 are formed such that they are connected to each other in series in the longitudinal direction L of the substrate 108 by the lower electrode 112 and the upper electrode 118, but the present invention is not limited thereto. For example, the solar battery cells 120 may be formed such that they are connected to each other in series in the width direction by the lower electrode 112 and the upper electrode 118.

In the solar battery cell 120, both the lower electrode 112 and the upper electrode 118 are electrodes for taking out the electric current generated by the photoelectric conversion layer 114. Both the lower electrode 112 and the upper electrode 118 are formed of a conductive material. The upper electrode 118 into which the light comes needs to have light transmitting properties.

The lower electrode 112 (back electrode) is constituted with, for example, Mo, Cr, or W and a combination of these. The lower electrode 112 may have a single layer structure or a laminated structure such as a double layer structure. It is preferable that the lower electrode 112 is constituted with Mo.

The thickness of the lower electrode 112 is preferably equal to or greater than 100 nm, and more preferably 0.45 to 1.0 µm.

The method for forming the lower electrode 112 is not particularly limited. The lower electrode 112 can be formed by a vapor-phase deposition method such as an electron beam vapor deposition method or a sputtering method.

The upper electrode (transparent electrode) 118 is constituted with, for example, ZnO, ITO (indium tin oxide), $SnO_2$, and a combination of these to which Al, B, Ga, Sb, and the like are added. The upper electrode 118 may have a single layer structure or a laminated structure such as a double layer structure. The thickness of the upper electrode 118 is not particularly limited, and is preferably 0.3 to 1 μm.

The method for forming the upper electrode 118 is not particularly limited. The upper electrode 118 can be formed by a vapor-phase deposition method such as an electron beam vapor deposition method or a sputtering method or a coating method.

The buffer layer 116 is formed for protecting the photoelectric conversion layer 114 at the time of forming the upper electrode 118 and for transmitting the light coming into the upper electrode 118 to the photoelectric conversion layer 114.

The buffer layer 116 is constituted with, for example, CdS, ZnS, ZnO, ZnMgO, ZnS (O, OH), and a combination of these.

The thickness of the buffer layer 116 is preferably 0.03 to 0.1 μm. Furthermore, the buffer layer 116 is formed by, for example, a chemical bath deposition (CBD) method.

The photoelectric conversion layer (light absorbing layer) 114 is a layer generating an electric current by absorbing the light which passes through the upper electrode 118 and buffer layer 116 and reaches the photoelectric conversion layer 114. The photoelectric conversion layer 114 has a photoelectric conversion function. In the present invention, the photoelectric conversion layer 114 is at least one kind of compound semiconductor formed of a group Ib element, a group IIIb element, and a group VIb element.

In view of obtaining a high light absorption rate and a high photoelectric conversion efficiency, the photoelectric conversion layer 114 is particularly preferably at least one kind of compound semiconductor formed of at least one kind of group Ib element selected from the group consisting of Cu and Ag, at least one kind of group IIIb element selected from the group consisting of Al, Ga, and In, and at least one kind of group VIb element selected from the group consisting of S, Se, and Te.

Examples of such a compound semiconductor include $CuAlS_2$, $CuGaS_2$, $CuInS_2$, $CuAlSe_2$, $CuGaSe_2$, $CuInSe_2$ (CIS), $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu(In_{1-x}Ga_x)Se_2$ (CIGS), $Cu(In_{1-x}Al_x)Se_2$, $Cu(In_{1-x}Ga_x)(S, Se)_2$, $Ag(In_{1-x}Ga_x)Se_2$, $Ag(In_{1-x}Ga_x)(S, Se)_2$, and the like.

It is particularly preferable that the photoelectric conversion layer 114 contains $CuInSe_2$(CIS) and/or $Cu(In, Ga)Se_2$ (CIGS) obtained by dissolving Ga in $CuInSe_2$(CIS). CIS and CIGS are semiconductors having a chalcopyrite crystal structure. It has been reported that these semiconductors have a high light absorption rate and a high photoelectric conversion efficiency. Furthermore, these semiconductors hardly undergo the deterioration of the efficiency by light irradiation and the like and have excellent durability.

The photoelectric conversion layer 114 contains impurities for obtaining the desired conductivity type of the semiconductor. The impurities can be incorporated into the photoelectric conversion layer 114 by the diffusion of the impurities from the adjacent layer and/or by active doping. In the photoelectric conversion layer 114, the constituent elements of the group I-III-VI semiconductor and/or the impurities may have a concentration distribution. Furthermore, the photoelectric conversion layer 114 may include a plurality of regions of layers of different semiconductor properties such as n-type, p-type, and i-type.

For example, in a CIGS system, in a case where the Ga amount in the photoelectric conversion layer 114 is caused to have a distribution in the thickness direction, the band gap width/carrier mobility and the like can be controlled, and a high photoelectric conversion efficiency can be designed.

The photoelectric conversion layer 114 may contain one kind or two or more kinds of semiconductors other than the group I-III-VI semiconductor. Examples of the semiconductors other than the group semiconductor include a semiconductor (group IV semiconductor) formed of a group IVb element such as Si, a semiconductor (group III-V semiconductor) formed of a group IIIb element such as GaAs and a group Vb element, a semiconductor (group II-VI semiconductor) formed of a group IIb element such as CdTe and a group VIb element, and the like. As long as the characteristics of the photoelectric conversion layer 114 are not impaired, the photoelectric conversion layer 114 may contain optional components other than the impurities for obtaining the desired conductivity type.

The content of the group semiconductor in the photoelectric conversion layer 114 is not particularly limited. The content of the group semiconductor in the photoelectric conversion layer 114 is preferably equal to or greater than 75% by mass, more preferably equal to or greater than 95% by mass, and particularly preferably equal to or greater than 99% by mass.

The photoelectric conversion layer 114 may be formed by a known method. For example, in a case where a CIGS layer is used as the photoelectric conversion layer 114, the layer may be formed by a known method such as a multi-source simultaneous vapor deposition method, a selenization method, a sputtering method, a hybrid sputtering method, or a mechanochemical processing method.

In the solar cell module 90 shown in FIG. 4, the bonding layer 94 is provided on the solar battery cell 120 side of the module body 92, and the barrier film 10 of the embodiment of the present invention is bonded to the bonding layer 94. In this way, the module body 92 (solar battery cell) is sealed with the barrier film 10.

As the bonding layer 94, known materials such as an optical clear adhesive (OCA), an optical clear double-sided tape, an ultraviolet curable type resin, an epoxy-based thermosetting resin, and a silicone-based adhesive resin that are used for bonding of a sheet-like substance in an optical device and an optical element may be used.

As described above, the barrier film 10 of the embodiment of the present invention has the protective organic layer 18 which is hard and exhibits high adhesiveness with respect to the inorganic layer 16.

Accordingly, even though the barrier film 10 is bonded to the module body 92 through RtoR by using nip rollers or the like having a strong nip force in a state of performing heating or the like, it is possible to prevent the damage of the inorganic layer 16 of the barrier film 10.

As a result, the barrier film 10 can suitably prevent moisture or the like from permeating the solar battery cell 120. That is, the solar cell module 90 of the present invention is a solar cell module having excellent durability that prevents the deterioration of the solar battery cell 120 resulting from moisture or the like and exhibits a predetermined power generation capacity over a long period of time.

The solar cell of the embodiment of the present invention can also be suitably used in a solar cell module, in which an organic thin film solar battery cell is used, in addition to the aforementioned solar cell module.

As the organic thin film solar battery cell, known ones may be used.

Hitherto, the gas barrier film, the solar cell, and the manufacturing method of a gas barrier film of the embodiment of the present invention have been specifically described, but the present invention is not limited to the above examples. It goes without saying that as long as the gist of the present invention is maintained, the present invention may be ameliorated or modified in various ways.

EXAMPLES

Hereinafter, the present invention will be more specifically described based on specific examples of the present invention.

Example 1

<Support>

As the support 12, a PET film (manufactured by Toyobo Co., Ltd., COSMOSHINE A4300) having a width of 1,000 mm, a thickness of 100 μm, and a length of 100 m was used.

<Formation of Undercoat Organic Layer 14>

TMPTA (manufactured by Daicel-Cytec Company Ltd.) and a photopolymerization initiator (manufactured by Lamberti S.p.A., ESACURE KT046) were prepared and weighed such that a mass ratio therebetween became 95:5. These components were dissolved in methyl ethyl ketone (MEK) such that the concentration of solid contents thereof became 15% by mass, thereby preparing a polymerizable composition for forming the undercoat organic layer 14.

The polymerizable composition for forming the undercoat organic layer 14 was loaded on a predetermined position in the coating portion 26 of the organic deposition apparatus 20 for performing RtoR shown in FIG. 2. Furthermore, the material roll 42 prepared by winding the support 12 in the form of a roll was loaded on the rotation shaft 32, and the support 12 (material Za for deposition) was inserted into a predetermined transport path. In addition, the feeding roll 48 prepared by winding the protective film Ga made of PE was loaded on a predetermined position such that the film is laminated on the undercoat organic layer 14 in the transport roller pair 38.

In the organic deposition apparatus 20, the support 12 was coated with the polymerizable composition in the coating portion 26 while being transported in the longitudinal direction, and the polymerizable composition was dried in the drying portion 28. In the coating portion 26, a die coater was used. In the drying portion 28, the heating temperature was 50° C., and the transit time was 3 minutes.

Then, in the light irradiation portion 30, the polymerizable composition was cured by being irradiated with ultraviolet rays (cumulative irradiation amount: about 600 mJ/cm$^2$), thereby forming the undercoat organic layer 14. In the transport roller pair 38, the protective film Ga was laminated on the surface of the undercoat organic layer 14, and then the resulting film was wound up, thereby obtaining the material roll 46 prepared by winding the support 12 (material Zb for deposition) including the undercoat organic layer 14 formed on the surface thereof. The thickness of the undercoat organic layer 14 was 1 μm.

<Formation of Inorganic Layer 16>

The material roll 46 prepared by winding the support 12 (material Zb for deposition) on which the undercoat organic layer 14 was formed was loaded on the rotation shaft 56 in the feeding chamber 50 of the inorganic deposition apparatus 24 which performs deposition by Capacitively Coupled Plasma-CVD (CCP-CVD) shown in FIG. 3, and the material Zb for deposition was inserted into a predetermined transport path. Furthermore, the feeding roll 73 prepared by winding the protective film Gb made of PE was loaded on a predetermined position such that the film was laminated on the inorganic layer 16 in the pass roller 72.

In this CVD deposition apparatus, while the support 12 on which the undercoat organic layer 14 was formed was being transported in the longitudinal direction, the protective film Ga was peeled by the pass roller 68 in the deposition chamber 52, and then a silicon nitride film was formed on the undercoat organic layer 14 as the inorganic layer 16. Thereafter, in the pass roller 72, the protective film Gb was laminated on the surface of the inorganic layer 16. Then, in the winding-up chamber 54, the resulting film was wound up by the winding-up shaft 58, thereby obtaining the material roll 42 prepared by winding the support 12 on which the undercoat organic layer 14 and the inorganic layer 16 were formed.

As raw material gases forming the inorganic layer 16, silane gas (flow rate: 160 sccm), ammonia gas (flow rate: 370 scan), hydrogen gas (flow rate: 590 sccm), and nitrogen gas (flow rate: 240 sccm) were used. As a power source, a high-frequency power source of a frequency of 13.56 MHz was used, and the plasma excitation power was 800 W. The deposition pressure was 40 Pa. The film thickness of the inorganic layer 16 was 30 nm.

<Formation of Protective Organic Layer 18>

As a graft copolymer, ACRIT 8BR-930 (UV curable type urethane acryl polymer having a weight-average molecular weight of 16,000) manufactured by TAISEI FINE CHEMICAL CO., LTD was prepared.

As a (meth)acrylate polymer, DIANAL BR83 (polymethyl methacrylate (PMMA) having a weight-average molecular weight of 40,000) manufactured by MITSUBISHI RAYON CO., LTD was prepared.

As a (meth)acrylate monomer having three or more functional groups, A-DPH (dipentaerythritol hexaacrylate (DPHA)) manufactured by SHIN-NAKAMURA CHEMICAL CO., LTD was prepared.

As a silane coupling agent having one or more (meth) acryloyl groups, KBM 5103 manufactured by Shin-Etsu Silicones was prepared.

Furthermore, as a photopolymerization initiator, ESACURE KT046 manufactured by Lamberti S.p.A. was prepared.

These materials were weighed such that a mass ratio of graft copolymer:PMMA:acrylate monomer:silane coupling agent:photopolymerization initiator became 35:22:30:10:3 and dissolved in methyl ethyl ketone, thereby preparing a polymerizable composition for forming the protective organic layer 18 having a concentration of solid contents of 30%.

The polymerizable composition for forming the protective organic layer 18 was loaded on a predetermined position of the coating portion 26 in the organic deposition apparatus 20 for performing RtoR shown in FIG. 2. Furthermore, the material roll 42 prepared by winding the support 12 (material Zc for deposition) on which the undercoat organic layer 14 and the inorganic layer 16 were formed was loaded on the rotation shaft 32, and the material Zc for deposition was inserted into a predetermined transport path.

In the organic deposition apparatus 20, while the material Zc for deposition was being transported in the longitudinal direction, the protective film Gb was peeled in the transport roller pair 36, the inorganic layer 16 was then coated with the polymerizable composition by the coating portion 26, and the polymerizable composition was dried in the drying portion 28. In the coating portion 26, a die coater was used. In the drying portion 28, the heating temperature was 130° C., and the transit times was 3 minutes. The surface temperature of the support 12 that was measured using a non-contact type laser thermometer (manufactured by KEYENCE CORPORATION, FTH50) was 128° C.

Thereafter, in a state where the resulting film was being heated to 80° C. from the rear surface thereof, the polymerizable composition was cured by being irradiated with ultraviolet rays (cumulative irradiation amount: about 600 mJ/cm$^2$) in the light irradiation portion 30 such that the protective organic layer 18 was formed, thereby preparing the barrier film 10. The thickness of the protective organic layer 18 was 10 µm.

Example 2

As a urethane acrylate oligomer, CN790 manufactured by Sartomer was prepared.

The urethane acrylate oligomer was added to the polymerizable composition for forming the protective organic layer 18 in Example 1. The urethane acrylate oligomer, the graft copolymer, PMMA, the acrylate monomer, the silane coupling agent, and the photopolymerization initiator were weighed such that a mass ratio of urethane acrylate oligomer:graft copolymer:PMMA:acrylate monomer:silane coupling agent:photopolymerization initiator became 4:33:20:30:10:3, and these components were dissolved in methyl ethyl ketone, thereby preparing a polymerizable composition for forming the protective organic layer 18 having a concentration of solid contents of 30%.

The barrier film 10 was prepared in the same manner as in Example 1, except that the protective organic layer 18 was formed using the polymerizable composition.

Example 3

A polymerizable composition for forming the protective organic layer 18 having a concentration of solid contents of 30% was prepared in the same manner as in Example 1, except that in the polymerizable composition for forming the protective organic layer 18, the graft copolymer, PMMA, the acrylate monomer, the silane coupling agent, and the photopolymerization initiator were weighted such that a mass ratio of graft copolymer:PMMA:acrylate monomer:silane coupling agent:photopolymerization initiator became 45:32:10:10:3.

The barrier film 10 was prepared in the same manner as in Example 1, except that the protective organic layer 18 was formed using the polymerizable composition.

Example 4

A polymerizable composition for forming the protective organic layer 18 having a concentration of solid contents of 30% was prepared in the same manner as in Example 1, except that in the polymerizable composition for forming the protective organic layer 18, the graft copolymer, PMMA, the acrylate monomer, the silane coupling agent, and the photopolymerization initiator were weighted such that a mass ratio of graft copolymer:PMMA:acrylate monomer:silane coupling agent:photopolymerization initiator became 25:12:50:10:3.

The barrier film 10 was prepared in the same manner as in Example 1, except that the protective organic layer 18 was formed using the polymerizable composition.

Example 5

The barrier film 10 was prepared in the same manner as in Example 1, except that in the formation of the protective organic layer 18, the coating amount of the polymerizable composition for forming the protective organic layer 18 in the coating portion 26 was controlled such that the film thickness of the protective organic layer 18 became 3 µm.

Example 6

The barrier film 10 was prepared in the same manner as in Example 1, except that in the formation of the protective organic layer 18, the coating amount of the polymerizable composition for forming the protective organic layer 18 in the coating portion 26 was controlled such that the film thickness of the protective organic layer 18 became 30 µm.

Example 7

As a (meth)acrylate monomer having three or more functional groups, the following compound EA was prepared.

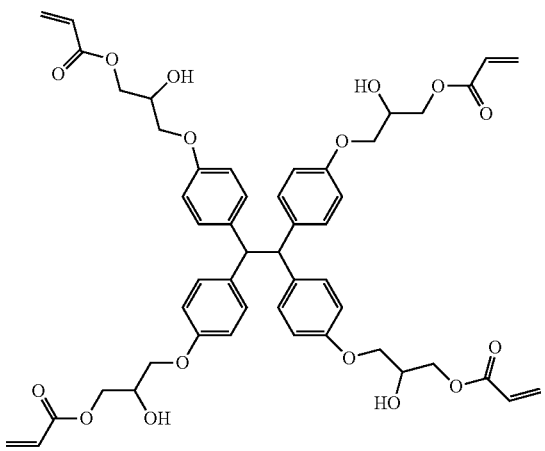

Compound EA

The (meth)acrylate monomer was added to the polymerizable composition for forming the protective organic layer 18 in Example 1, and the graft copolymer, PMMA, the acrylate monomer (DPHA), the acrylate monomer (compound EA), the silane coupling agent, and the photopolymerization initiator were weighed such that a mass ratio of graft copolymer:PMMA:acrylate monomer (DPHA):acrylate monomer (compound EA):silane coupling agent:photopolymerization initiator became 35:22:20:10:10:3. These components were dissolved in methyl ethyl ketone, thereby preparing a polymerizable composition for forming the protective organic layer 18 having a concentration of solid contents of 30%.

The barrier film 10 was prepared in the same manner as in Example 1, except that the protective organic layer 18 was formed using the polymerizable composition.

Example 8

As a urethane acrylate oligomer, CN790 manufactured by Sartomer was prepared.

Furthermore, as a (meth)acrylate monomer having three or more functional groups, the compound EA was prepared.

The urethane acrylate oligomer and the (meth)acrylate monomer were added to the polymerizable composition for forming the protective organic layer 18 in Example 1, and the urethane acrylate oligomer, the graft copolymer, PMMA, the acrylate monomer (DPHA), the acrylate monomer (compound EA), the silane coupling agent, and the photopolymerization initiator were weighed such that a mass ratio of urethane acrylate oligomer:graft copolymer:PMMA:acrylate monomer (DPHA):acrylate monomer (compound EA): silane coupling agent:photopolymerization initiator became 4:33:20:20:10:10:3. These components were dissolved in methyl ethyl ketone, thereby preparing a polymerizable composition for forming the protective organic layer 18 having a concentration of solid contents of 30%.

The barrier film 10 was prepared in the same manner as in Example 1, except that the protective organic layer 18 was formed using the polymerizable composition.

Example 9

As a lubricating agent, MX-80H3wT (acryl polymer particles having an average particle diameter of 0.8 µm) manufactured by Soken Chemical & Engineering Co., Ltd was prepared.

The lubricating agent was added to the polymerizable composition for forming the protective organic layer 18 in Example 1, and the graft copolymer, PMMA, the acrylate monomer, the silane coupling agent, the photopolymerization initiator, and the lubricating agent were weighed such that a mass ratio of graft copolymer:PMMA:acrylate monomer:silane coupling agent:photopolymerization initiator:lubricating agent became 34:22:30:10:3:1. These components were dissolved in methyl ethyl ketone, thereby preparing a polymerizable composition for forming the protective organic layer 18 having a concentration of solid contents of 30%.

The barrier film 10 was prepared in the same manner as in Example 1, except that the protective organic layer 18 was formed using the polymerizable composition.

Example 10

As a urethane acrylate oligomer, CN790 manufactured by Sartomer was prepared.

Furthermore, as a (meth)acrylate monomer having three or more functional groups, the compound EA was prepared.

In addition, as a lubricating agent, MX-80H3wT (acryl polymer particles having an average particle diameter of 0.8 µm) manufactured by Soken Chemical & Engineering Co., Ltd was prepared.

The urethane acrylate oligomer, the (meth)acrylate monomer (compound EA), and the lubricating agent were added to the polymerizable composition for forming the protective organic layer 18 in Example 1, and the urethane acrylate oligomer, the graft copolymer, PMMA, the acrylate monomer (DPHA), the acrylate monomer (EA), the silane coupling agent, the photopolymerization initiator, and the lubricating agent were weighed such that a mass ratio of urethane acrylate oligomer:graft copolymer:PMMA:acrylate monomer (DPHA):acrylate monomer (EA):silane coupling agent: photopolymerization initiator:lubricating agent became 4:32:20:20:10:10:3:1. These components were dissolved in methyl ethyl ketone, thereby preparing a polymerizable composition for forming the protective organic layer 18 having a concentration of solid contents of 30%.

The barrier film 10 was prepared in the same manner as in Example 1, except that the protective organic layer 18 was formed using the polymerizable composition.

Example 11

The Barrier film 10 was prepared in the same manner as in Example 1, except that in the formation of the protective organic layer 18, the drying temperature of the polymerizable composition for forming the protective organic layer 18 was 100° C. The temperature of the support 12 measured in the same manner as in Example 1 was 99° C.

Example 12

The Barrier film 10 was prepared in the same manner as in Example 1, except that in the formation of the protective organic layer 18, the drying temperature of the polymerizable composition for forming the protective organic layer 18 was 150° C. The temperature of the support 12 measured in the same manner as in Example 1 was 148° C.

Example 13

As a (meth)acrylate polymer, DIANAL BR113 (polymethyl methacrylate (PMMA) having a weight-average molecular weight of 30,000) manufactured by MITSUBISHI RAYON CO., LTD was prepared.

A polymerizable composition for forming the protective organic layer 18 was prepared in the same manner as in Example 1, except that DIANAL BR113 was used instead of DIANAL BR83 as a (meth)acrylate polymer.

The barrier film 10 was prepared in the same manner as in Example 1, except that the protective organic layer 18 was formed using the polymerizable composition.

Example 14

<Preparation of Support>

PET having an intrinsic viscosity of 0.66 that was obtained by polycondensation using an antimony compound as a catalyst was dried until the moisture content thereof became equal to or lower than 50 ppm, and dissolved in an extruder in which a heater temperature was set to be 280° C. to 300° C. The dissolved PET resin was jet from a die portion onto a chill roll to which static electricity was applied, thereby obtaining an amorphous base. The obtained amorphous base was stretched 310% in the moving direction of the base.

Then, by means of coating (in-line coating), one surface of the film obtained by stretching was coated with the following coating solution A for an easily adhesive layer, and the opposite surface of the film was coated with the following coating solution B for an easily adhesive layer. The coating solutions were dried and then stretched 380% in the width direction, thereby obtaining the support 12 made of PET with easily adhesive layers having undergone in-line coating. The thickness of the support was 100 jam.

The support was coated with the coating solution A for an easily adhesive layer and the coating solution B for an easily adhesive layer such that the thickness of both the coating solutions after drying and stretching became 75 nm.

<<Coating Solution a for Easily Adhesive Layer>>

A composition containing the following components was prepared.

| | |
|---|---|
| Self-crosslinking urethane (manufactured by DKS Co., Ltd., ELASTRON H-3-DF) | 164.9 parts by mass |
| Catalyst (manufactured by DKS Co., Ltd., ELASTRON CAT-21) | 3.3 parts by mass |
| Blocked polyisocyanate (manufactured by Asahi Kasei Corporation., DURANATE WM44-L70G) | 7.7 parts by mass |
| Anionic surfactant (manufactured by NOF CORPORATION, RAPISOL A-90) | 0.4 parts by mass |
| Hydrous amorphous silicon dioxide (manufactured by Tosoh Silica Corporation, NIPGEL AZ-204) | 0.1 parts by mass |
| Colloidal silica (manufactured by FUSO CHEMICAL CO., LTD., PL-3-D) | 7.4 parts by mass |
| Carnauba wax dispersion (manufactured by CHUKYO YUSHI CO., LTD., CELLOZOL 524DK) | 4.9 parts by mass |

The pH of the composition containing the above components was controlled to be 5.1, and then distilled water was added thereto by controlling the amount thereof such that the total amount of the composition became 1,000 parts by mass, thereby preparing the coating solution A for an easily adhesive layer.

<<Coating Solution B for Easily Adhesive Layer>>

A composition containing the following components was prepared.

| | |
|---|---|
| Self-crosslinking urethane (manufactured by DKS Co., Ltd., ELASTRON H-3-DF) | 164.9 parts by mass |
| Catalyst (manufactured by DKS Co., Ltd., ELASTRON CAT-21) | 3.3 parts by mass |
| Blocked polyisocyanate (manufactured by Asahi Kasei Corporation., DURANATE WM44-L70G) | 7.7 parts by mass |
| Anionic surfactant (manufactured by NOF CORPORATION, RAPISOL A-90) | 0.4 parts by mass |
| Colloidal silica (manufactured by FUSO CHEMICAL CO., LTD., PL-3-D) | 7.4 parts by mass |
| Carnauba wax dispersion (manufactured by CHUKYO YUSHI CO., LTD., CELLOZOL 524DK) | 4.9 parts by mass |

The pH of the composition containing the above components was controlled to be 5.1, and then distilled water was added thereto by controlling the amount thereof such that the total amount of the composition became 1,000 parts by mass, thereby preparing the coating solution B for an easily adhesive layer.

<Formation of Firm Adhesive Layer>

By using a bar coater, the surface, on which the easily adhesive layer was formed using the coating solution A for an easily adhesive layer, of the support 12 made of PET with the prepared easily adhesive layers was coated with the following coating solution for a firm adhesive layer at a thickness of 10 cc/m². The coating solution was dried for 2 minutes at 150° C., thereby forming a firm adhesive layer having a dry film thickness of 1.5 μm.

<<Coating Solution for Firm Adhesive Layer>>

A water-soluble oxazoline-based crosslinking agent (15.07% by mass, manufactured by NIPPON SHOKUBAI CO., LTD., EPOCROS WS-700) as a crosslinking agent, 59.27% by mass of a polyolefin resin (manufactured by UNITIKA LTD., AROBASE SE-1013N) and 24.79% by mass of a polyurethane resin (manufactured by Mitsui Chemicals, Inc., TAKELAC S-5100) as binders, 0.09% by mass of a fluorine-based surfactant (manufactured by Fujifilm Finechemicals Co., Ltd., sodium bis(3,3,4,4,5,5,6,6,6-nonafluorohexyl)sulfosuccinate, solid contents: 2% by mass) and 0.18% by mass of a nonionic surfactant (manufactured by Sanyo Chemical Industries, Ltd., NAROACTY CL95, solid contents: 1% by mass) as surfactants, and 0.6% by mass of silica particles (manufactured by Tosoh Silica Corporation, AZ-204, primary particles: 1.5 to 1.9 μm) as a matting agent were mixed together.

Distilled water was added to the mixture, and the concentration of solid contents thereof was controlled to be 10% by mass, thereby preparing a coating solution for a firm adhesive layer.

<Preparation of Gas Barrier Film>

On a surface, which was opposite to the firm adhesive layer, of the support 12 on which the firm adhesive layer was formed (on the easily adhesive layer formed using the coating solution B for an easily adhesive layer), the undercoat organic layer 14, the inorganic layer 16, and the protective organic layer 18 were formed in the same manner as in Example 1, thereby preparing a gas barrier film.

Comparative Example 1

A polymerizable composition for forming the protective organic layer 18 having a concentration of solid contents of 30% was prepared in the same manner as in Example 1, except that in the preparation of the polymerizable composition for forming the protective organic layer 18, the (meth)acrylate polymer (DIANAL BR83) was not used, and the graft copolymer, the acrylate monomer, the silane coupling agent, and the photopolymerization initiator were weighed such that a mass ratio of graft copolymer:acrylate monomer:silane coupling agent:photopolymerization initiator became 46:41:10:3.

The barrier film 10 was prepared in the same manner as in Example 1, except that the protective organic layer 18 was formed using the polymerizable composition.

Comparative Example 2

A polymerizable composition for forming the protective organic layer 18 having a concentration of solid contents of 30% was prepared in the same manner as in Example 1, except that in the preparation of the polymerizable composition for forming the protective organic layer 18, the (meth)acrylate monomer (DPHA) having three or more functional groups was not used, and the graft copolymer, PMMA, the silane coupling agent, and the photopolymerization initiator were weighed such that a mass ratio of graft copolymer:PMMA:silane coupling agent:photopolymerization initiator became 50:37:10:3.

The barrier film 10 was prepared in the same manner as in Example 1, except that the protective organic layer 18 was formed using the polymerizable composition.

Comparative Example 3

A polymerizable composition for forming the protective organic layer 18 having a concentration of solid contents of 30% was prepared in the same manner as in Example 1, except that in the preparation of the polymerizable composition for forming the protective organic layer 18, the graft copolymer (ACRIT 8BR-930) was not used, and PMMA, the acrylate monomer, the silane coupling agent, and the photopolymerization initiator were weighed such that a mass ratio of PMMA:acrylate monomer:silane coupling agent:photopolymerization initiator became 37:50:10:3.

The barrier film 10 was prepared in the same manner as in Example 1, except that the protective organic layer 18 was formed using the polymerizable composition.

Comparative Example 4

A polymerizable composition for forming the protective organic layer 18 having a concentration of solid contents of 30% was prepared in the same manner as in Example 1, except that in the preparation of the polymerizable composition for forming the protective organic layer 18, the silane coupling agent (KBM 5103) was not used, and the graft copolymer, PMMA, the acrylate monomer, and the photopolymerization initiator were weighed such that a mass ratio of graft copolymer:PMMA:acrylate monomer:photopolymerization initiator became 40:22:35:3.

The barrier film 10 was prepared in the same manner as in Example 1, except that the protective organic layer 18 was formed using the polymerizable composition.

Comparative Example 5

As a (meth)acrylate monomer, A-200 (polyethylene glycol #200 diacrylate) manufactured by SHIN-NAKAMURA CHEMICAL CO., LTD was prepared.

A polymerizable composition for forming the protective organic layer 18 was prepared in the same manner as in Example 1, except that A-200 was used instead of A-DPH (DPHA) as the (meth)acrylate monomer having three or more functional groups.

The barrier film 10 was prepared in the same manner as in Example 1, except that the protective organic layer 18 was formed using the polymerizable composition.

[Evaluation]

For the barrier films 10 prepared as above, the pencil hardness of the protective organic layer 18, the adhesiveness between the inorganic layer 16 and the protective organic layer 18, the durability, and the tensile strength were evaluated.

<Pencil Hardness>

Based on JIS K 5600-5-4, the pencil hardness of the protective organic layer 18 was measured.

<Adhesiveness Between Inorganic Layer 16 and Protective Organic Layer 18>

The adhesiveness between the inorganic layer 16 and the protective organic layer 18 was evaluated by the cross-cut peeling test based on JIS K5400.

Within the surface, on which the protective organic layer 18 was formed, of each of the gas barrier films, by using a cutter knife, cuts meeting the film surface at an angle of 90° were made at an interval of 1 mm, thereby forming 100 grids at an interval of 1 mm. A Mylar tape (manufactured by NITTO DENKO CORPORATION, polyester tape, NO. 31B) having a width of 2 cm was bonded onto the grids and then peeled. Based on the number of remaining grids of the protective organic layer 18, the adhesiveness was evaluated.

The cross-cut peeling test was performed as two kinds of tests including a test performed at the initial stage and a test performed after the gas barrier film was left to stand for 100 hours in an environment with a temperature of 85° C. and a relative humidity of 85% RH.

<Durability>

The moisture vapor transmission rate of the initial stage, the moisture vapor transmission rate after a sapphire needle scraping test, and the moisture vapor transmission rate after a falling ball test were measured so as to evaluate the durability of the barrier film 10.

The moisture vapor transmission rate [g/(m$^2$·day)] was measured by a calcium corrosion method (method described in JP2005-283561A) under the condition of a temperature of 40° C. and a relative humidity of 90% RH.

The sapphire needle scraping test was performed using a 0.1 mm sapphire needle based in JIS K5600-5-5. Furthermore, the sapphire needle scraping test was performed under three kinds of loads including a load of 5 g, a load of 10 g, and a load of 20 g.

For performing the falling ball test, the barrier film 10 was placed on a rubber sheet made of nitrile rubber (NBR), a ball having a diameter of 1.5 inches (38.1 mm) was dropped thereto from a height of 50 cm, and the moisture vapor transmission rate was measured using a sample including the position in which the ball collided with the barrier film.

<Tensile Strength>

The barrier film 10 was cut in the form of a stripe having a length of 150 mm and a width of 20 mm, and by using a TENSILON universal testing machine RTF 1210, the stretching rate [%] at which cracks were visually observed in the undercoat organic layer 14 was measured.

The results are shown in the following table.

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Protective organic layer | Graft copolymer | 35 | 33 | 45 | 25 | 35 | 35 | 35 | 33 | 34 |
| | Acrylate polymer (PMMA) | 22 | 20 | 32 | 12 | 22 | 22 | 22 | 20 | 22 |
| | Acrylate monomer (DPHA) | 30 | 30 | 10 | 50 | 30 | 30 | 20 | 20 | 30 |
| | Acrylate monomer (EA) | | | | | | | 10 | 10 | |
| | Acrylate monomer (A-200) | | | | | | | | | |
| | Silane coupling agent | 10 | 10 | 10 | 10 | 10 | 10 | 10 | 10 | 10 |
| | Urethane acrylate oligomer | | 4 | | | | | | 4 | |
| | Photopolymerization initiator | 3 | 3 | 3 | 3 | 3 | 3 | 3 | 3 | 3 |
| | Lubricating agent | | | | | | | | | 1 |
| | Drying temperature [°C.] | 130 | 130 | 130 | 130 | 130 | 130 | 130 | 130 | 130 |
| | Thickness [μm] | 10 | 10 | 10 | 10 | 3 | 30 | 10 | 10 | 10 |

TABLE 1-continued

| Evaluation | Pencil hardness | | 3H | 2H | H | 4H | 2H | 3H | 2H | 2H | 2H |
|---|---|---|---|---|---|---|---|---|---|---|---|
| | Adhesiveness | Initial stage | 100/100 | 100/100 | 100/100 | 90/100 | 100/100 | 90/100 | 100/100 | 100/100 | 100/100 |
| | | After being left at 85° C. and 85% RH | 90/100 | 98/100 | 100/100 | 80/100 | 100/100 | 80/100 | 99/100 | 100/100 | 95/100 |
| | Durability | Initial stage | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ |
| | | Sapphire needle scraping load 5 g | $1.3 \times 10^{-4}$ | $1.3 \times 10^{-4}$ | $1.3 \times 10^{-4}$ | $1.3 \times 10^{-4}$ | $2.1 \times 10^{-4}$ | $1.3 \times 10^{-4}$ | $1.3 \times 10^{-4}$ | $1.3 \times 10^{-4}$ | $1.3 \times 10^{-4}$ |
| | | Sapphire needle scraping load 10 g | $1.3 \times 10^{-4}$ | $1.5 \times 10^{-4}$ | $1.7 \times 10^{-4}$ | $1.3 \times 10^{-4}$ | $2.7 \times 10^{-4}$ | $1.3 \times 10^{-4}$ | $1.5 \times 10^{-4}$ | $1.5 \times 10^{-4}$ | $1.5 \times 10^{-4}$ |
| | | Sapphire needle scraping load 20 g | $1.6 \times 10^{-4}$ | $1.8 \times 10^{-4}$ | $1.9 \times 10^{-4}$ | $1.4 \times 10^{-4}$ | $3.7 \times 10^{-4}$ | $1.3 \times 10^{-4}$ | $1.8 \times 10^{-4}$ | $1.8 \times 10^{-4}$ | $1.8 \times 10^{-4}$ |
| | | Falling ball test | $1.3 \times 10^{-4}$ | $1.3 \times 10^{-4}$ | $1.3 \times 10^{-4}$ | $1.3 \times 10^{-4}$ | $2.2 \times 10^{-4}$ | $1.3 \times 10^{-4}$ | $1.3 \times 10^{-4}$ | $1.3 \times 10^{-4}$ | $1.3 \times 10^{-4}$ |
| | Tensile strength [%] | | 3.5 | 3.5 | 3.5 | 3.5 | 2.5 | 4 | 3.5 | 3.5 | 3.5 |

| | | | Example 10 | Example 11 | Example 12 | Example 13 | Example 14 | Comparative Example 1 | Comparative Example 2 | Comparative Example 3 | Comparative Example 4 | Comparative Example 5 |
|---|---|---|---|---|---|---|---|---|---|---|---|---|
| Protective organic layer | Graft copolymer | | 32 | 35 | 35 | 35 | 35 | 46 | 50 | | 40 | 35 |
| | Acrylate polymer (PMMA) | | 20 | 22 | 22 | *22 | 22 | | 37 | 37 | 22 | 22 |
| | Acrylate monomer (DPHA) | | 20 | 30 | 30 | 30 | 30 | 41 | | 50 | 35 | |
| | Acrylate monomer (EA) | | 10 | | | | | | | | | |
| | Acrylate monomer (A-200) | | | | | | | | | | | 30 |
| | Silane coupling agent | | 10 | 10 | 10 | 10 | 10 | 10 | 10 | 10 | | 10 |
| | Urethane acrylate oligomer | | 4 | | | | | | | | | |
| | Photopolymerization initiator | | 3 | 3 | 3 | 3 | 3 | 3 | 3 | 3 | 3 | 3 |
| | Lubricating agent | | 1 | | | | | | | | | |
| | Drying temperature [° C.] | | 130 | 100 | 150 | 130 | 130 | 130 | 130 | 130 | 130 | 130 |
| | Thickness [µm] | | 10 | 10 | 10 | 10 | 10 | 10 | 10 | 10 | 10 | 10 |
| Evaluation | Pencil hardness | | 2H | 3H | 3H | 3H | 3H | 3H | F | 4H | 3H | HB |
| | Adhesiveness | Initial stage | 100/100 | 100/100 | 100/100 | 100/100 | 100/100 | 30/100 | 100/100 | 15/100 | 0/100 | 100/100 |
| | | After being left at 85° C. and 85% RH | 100/100 | 90/100 | 90/100 | 85/100 | 90/100 | 5/100 | 95/100 | 0/100 | 0/100 | 90/100 |
| | Durability | Initial stage | $9.2 \times 10^{-5}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-1}$ |
| | | Sapphire needle scraping load 5 g | $1.3 \times 10^{-4}$ | $1.5 \times 10^{-4}$ | $1.3 \times 10^{-4}$ | $1.3 \times 10^{-4}$ | $1.3 \times 10^{-4}$ | $1.7 \times 10^{-4}$ | $6.2 \times 10^{-3}$ | $2.2 \times 10^{-2}$ | $5.1 \times 10^{-2}$ | $1.3 \times 10^{-2}$ |
| | | Sapphire needle scraping load 10 g | $1.5 \times 10^{-4}$ | $1.6 \times 10^{-4}$ | $1.3 \times 10^{-4}$ | $1.3 \times 10^{-4}$ | $1.3 \times 10^{-4}$ | $1.5 \times 10^{-4}$ | $3.1 \times 10^{-2}$ | $4.2 \times 10^{-2}$ | $6.0 \times 10^{-2}$ | $5.1 \times 10^{-2}$ |
| | | Sapphire needle scraping load 20 g | $1.8 \times 10^{-4}$ | $1.8 \times 10^{-4}$ | $1.5 \times 10^{-4}$ | $1.5 \times 10^{-4}$ | $1.6 \times 10^{-4}$ | $2.1 \times 10^{-4}$ | $5.0 \times 10^{-2}$ | $7.3 \times 10^{-2}$ | $8.0 \times 10^{-2}$ | $8.0 \times 10^{-2}$ |
| | | Falling ball test | $1.3 \times 10^{-4}$ | $1.3 \times 10^{-4}$ | $1.3 \times 10^{-4}$ | $1.3 \times 10^{-4}$ | $1.3 \times 10^{-4}$ | $1.3 \times 10^{-4}$ | $2.0 \times 10^{-3}$ | $1.3 \times 10^{-4}$ | $7.0 \times 10^{-4}$ | $2.0 \times 10^{-2}$ |
| | Tensile strength [%] | | 3.5 | 2.5 | 4 | 3.3 | 3 | 3.5 | 3.5 | 3.5 | 3.5 | 3.5 |

The molecular weight of PMMA is 30,000 only in Example 13. In other examples, the molecular weight of PMMA is 40,000.
Only in Example 16, the support has an easily adhesive layer on both surfaces thereof and has a firm adhesive layer on the rear surface thereof.
DPHA is a hexafunctional (meth)acrylate monomer, EA is a tetrafunctional (meth)acrylate monomer, and A-200 is a difunctional (meth)acrylate monomer.

As shown in the table, in all of the gas barrier films 10 of the embodiment of the present invention, in which the protective organic layer 18 contained a polymerized substance of a graft copolymer, a polymerized substance of an acrylate monomer having three or more functional groups, a polymerized substance of the graft copolymer and the polymerized substance of the acrylate monomer having three or more functional groups, a (meth)acrylate polymer, and a silane coupling agent, the protective organic layer 18 was hard and exhibited excellent adhesiveness with respect to the inorganic layer 16. Accordingly, all of the gas barrier films 10 of the embodiment of the present invention had excellent durability.

Furthermore, in Example 14 having a firm adhesive layer on the rear surface of the support 12, due to the firm adhesive layer, the tensile strength was slightly lower than that of other examples. However, in other evaluations, Example 14 yielded the same results as other examples. That is, the gas barrier film of the embodiment of the present invention causes no problem even though the gas barrier film has a functional layer on the rear surface of the support 12.

In contrast, in Comparative Example 1 in which the protective organic layer 18 did not have a (meth)acrylate polymer, due to the internal stress resulting from the volumetric shrinkage at the time of forming the protective organic layer 18, the adhesiveness between the protective organic layer 18 and the inorganic layer 16 was extremely poor, and the durability was also low. In Comparative Example 2 in which the protective organic layer did not have an acrylate monomer having three or more functional groups, the crosslinking of the protective organic layer 18 was insufficient, the pencil hardness was low, and accordingly, the durability was also low. In Comparative Example 3 in which the protective organic layer 18 did not have a graft copolymer, the adhesiveness between the protective organic layer 18 and the inorganic layer 16 was extremely poor, and the durability was also low. In Comparative Example 4 in which the protective organic layer 18 did not have a silane coupling agent, the adhesiveness between the protective organic layer 18 and the inorganic layer 16 was extremely poor, and the durability was low. In Comparative Example 5 in which the (meth)acrylate monomer had two functional groups, the crosslinking of the protective organic layer 18 was insufficient, the pencil hardness was low, and accordingly, the durability was also low.

The above results clearly show the effects of the present invention.

The present invention can be suitably used in a solar cell and the like.

EXPLANATION OF REFERENCES

10: (gas) barrier film
12: support
14: undercoat organic layer
16: inorganic layer
18: protective organic layer
20: organic deposition apparatus
24: inorganic deposition apparatus
26: coating portion
28: drying portion
30: light irradiation portion
32, 56: rotation shaft
34, 58: winding-up shaft
36, 38: transport roller pair
42, 46: material roll
48, 73: feeding roll
49, 70: recovery roll
50: feeding chamber
52: deposition chamber
54: winding-up chamber
60, 68, 72, 80: pass roller
61, 74, 82: vacuum evacuation means
62: drum
64: deposition means
76, 78: partition
76a, 76b: opening
90: solar cell module
92: module body
94: bonding layer
102: (metal) substrate
104: Al layer
106: insulating layer
108: (insulating metal) substrate
112: lower electrode
113, 117, 119: gap
114: photoelectric conversion layer
116: buffer layer
118: upper electrode
120: solar battery cell
124: first conductive member
124a, 126a: copper ribbon
124b, 126b: coating material
126: second conductive member
130: alkali supply layer
Za, Zb, Zc: material for deposition
Ga, Gb: protective film

What is claimed is:

1. A gas barrier film comprising:
a support;
at least one inorganic layer on one surface of the support; and
a protective organic layer formed on a surface of the inorganic layer that is farthest from the support,
wherein the protective organic layer has a polymerized substance of a graft copolymer having an acryl polymer as a main chain and having, as a side chain, at least either an acryloyl group-terminated urethane polymer or an acryloyl group-terminated urethane oligomer, a polymerized substance of a (meth)acrylate monomer having three or more functional groups, a polymerized substance of the graft copolymer and the (meth)acrylate monomer having three or more functional groups, a (meth)acrylate polymer, and a silane coupling agent having one or more (meth)acryloyl groups.

2. The gas barrier film according to claim 1, wherein a weight-average molecular weight of the graft copolymer is equal to or greater than 10,000.

3. The gas barrier film according to claim 1, wherein the protective organic layer further has a urethane acrylate oligomer.

4. The gas barrier film according to claim 3, wherein a refractive index of a polymerized substance of the urethane acrylate oligomer is equal to or lower than 1.52.

5. The gas barrier film according to claim 1, wherein a refractive index of a cured substance of the polymerized substance of the graft copolymer and the (meth)acrylate polymer is equal to or lower than 1.52.

6. The gas barrier film according to claim 1, wherein a pencil hardness of the protective organic layer is equal to or higher than H.

7. The gas barrier film according to claim 1, wherein a thickness of the protective organic layer is 3 to 30 μm.

8. The gas barrier film according to claim 1 that has a haze equal to or lower than 1.5% and a total light transmittance equal to or higher than 88%.

9. The gas barrier film according to claim 1 that has a thermal shrinkage rate equal to or lower than 2%.

10. The gas barrier film according to claim 1, further comprising:
an undercoat organic layer on one surface of the support,
wherein the inorganic layer is on a surface of the undercoat organic layer, and
the protective organic layer is on a surface of the inorganic layer.

11. The gas barrier film according to claim 1, further comprising:
a firm adhesive layer containing a binder and lubricating particles on a surface, which is opposite to the surface having the inorganic layer and the protective organic layer, of the support.

12. A solar cell comprising:
a photoelectric conversion layer; and
the gas barrier film according to claim 1.

13. The solar cell according to claim 12,
wherein the photoelectric conversion layer is formed of a compound semiconductor including at least either an element Cu or an element Ag, at least one kind of element selected from the group consisting of Al, Ga, and In, and at least one kind of element selected from the group consisting of S, Se, and Te.

14. A gas barrier film comprising:
a support;
at least one inorganic layer on one surface of the support;
a protective organic layer formed on a surface of the inorganic layer that is farthest from the support; and
an undercoat organic layer on the one surface of the support,
wherein the inorganic layer is on a surface of the undercoat organic layer,
wherein the protective organic layer is on a surface of the inorganic layer,
wherein the protective organic layer has a polymerized substance of a graft copolymer having an acryl polymer as a main chain and having, as a side chain, at least either an acryloyl group-terminated urethane polymer or an acryloyl group-terminated urethane oligomer, a polymerized substance of a (meth)acrylate monomer having three or more functional groups, a polymerized substance of the graft copolymer and the (meth)acrylate monomer having three or more functional groups, a (meth)acrylate polymer, a silane coupling agent having one or more (meth)acryloyl groups, and a urethane acrylate oligomer, and
wherein a thickness of the protective organic layer is 3 to 30 μm.

15. The gas barrier film according to claim 14, further comprising:
a firm adhesive layer containing a binder and lubricating particles on a surface, which is opposite to the surface having the inorganic layer and the protective organic layer, of the support.

16. A solar cell comprising:
a photoelectric conversion layer; and
the gas barrier film according to claim 14.

17. A manufacturing method of a gas barrier film, comprising:
a step of forming at least one inorganic layer on one surface of a support; and
a step of forming at least one organic layer including forming a protective organic layer on a surface of the inorganic layer that is farthest from the support,
wherein the step of forming an organic layer includes a coating step of coating the surface, on which the organic layer is to be formed, with a polymerizable composition, a drying step of drying the polymerizable composition with which the surface, on which the organic layer is to be formed, is coated, and a curing step of curing the dried polymerizable composition,
in the forming of at least one organic layer, a drying temperature in the drying step is equal to or higher than 100° C., and
the coating step in the forming of the protective organic layer is a step of coating the surface of the inorganic layer that is farthest from the support with a polymerizable composition which contains a graft copolymer having an acryl polymer as a main chain and having, as a side chain, at least either an acryloyl group-terminated urethane polymer or an acryloyl group-terminated urethane oligomer, a (meth)acrylate monomer having three or more functional groups, a (meth)acrylate polymer, and a silane coupling agent having one or more (meth)acryloyl groups.

18. The manufacturing method of a gas barrier film according to claim 17,
wherein in the step of forming an organic layer, an undercoat organic layer that becomes an undercoat of the inorganic layer is formed on one surface of the support,
in the step of forming an inorganic layer, the inorganic layer is formed on a surface of the undercoat organic layer, and
in the step of forming an organic layer, the protective organic layer is formed on a surface of the inorganic layer formed on the surface of the undercoat organic layer.

19. The manufacturing method of a gas barrier film according to claim 17, further comprising:
a step of forming a firm adhesive layer containing a binder and lubricating particles on a surface, which is opposite to the surface on which the inorganic layer and the organic layer are formed, of the support.

* * * * *